(12) United States Patent
Sumiyoshi et al.

(10) Patent No.: US 11,742,876 B2
(45) Date of Patent: Aug. 29, 2023

(54) COMPRESSION DEVICE AND DECOMPRESSION DEVICE

(71) Applicant: Kioxia Corporation, Tokyo (JP)

(72) Inventors: Masato Sumiyoshi, Yokohama Kanagawa (JP); Keiri Nakanishi, Kawasaki Kanagawa (JP); Kohei Oikawa, Kawasaki Kanagawa (JP); Sho Kodama, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/688,368

(22) Filed: Mar. 7, 2022

(65) Prior Publication Data

US 2023/0006689 A1 Jan. 5, 2023

(30) Foreign Application Priority Data

Jul. 2, 2021 (JP) ................................ 2021-110809

(51) Int. Cl.
*H03M 7/34* (2006.01)
*H03M 7/30* (2006.01)
*G06F 3/06* (2006.01)

(52) U.S. Cl.
CPC ........ *H03M 7/3088* (2013.01); *G06F 3/0608* (2013.01); *G06F 3/0656* (2013.01); *G06F 3/0673* (2013.01); *H03M 7/6005* (2013.01); *H03M 7/6011* (2013.01)

(58) Field of Classification Search
CPC ............. H03M 7/3088; H03M 7/6005; H03M 7/6011; H03M 7/3084; H03M 7/40; H03M 7/3077; G06F 3/0608; G06F 3/0656; G06F 3/0673

USPC .......................................................... 341/51
See application file for complete search history.

(56) References Cited

U.S. PATENT DOCUMENTS

| | | | |
|---|---|---|---|
| 7,093,184 B2* | 8/2006 | Kim | H04L 1/0066 714/776 |
| 7,728,742 B2 | 6/2010 | Gonion | |
| 7,800,519 B2 | 9/2010 | Gonion | |
| 8,189,627 B2 | 5/2012 | Xia et al. | |
| 9,608,768 B2 | 3/2017 | Liu et al. | |
| 9,720,821 B2 | 8/2017 | Hung et al. | |
| 10,334,310 B2* | 6/2019 | Kwon | G11B 27/10 |
| 10,367,604 B2 | 7/2019 | Martin | |
| 10,721,019 B2 | 7/2020 | Martin | |
| 11,121,806 B2* | 9/2021 | Chen | H04L 1/0042 |
| 2002/0181603 A1* | 12/2002 | Kim | H04L 1/1816 375/265 |

(Continued)

*Primary Examiner* — Jean B Jeanglaude
(74) *Attorney, Agent, or Firm* — Foley & Lardner LLP

(57) ABSTRACT

According to one embodiment, an interleaving unit divides a symbol string into first and second symbols. A first coding unit converts the first symbols to first codewords. A first packet generating unit generates first packets including the first codewords. A first request generating unit generates first packet requests including sizes of variable length packets. A second coding unit converts the second symbols to second codewords. A second packet generating unit generates second packets including the second codewords. A second request generating unit generates second packet requests including sizes of variable length packets. A multiplexer outputs a compressed stream including the first and second variable length packets cut out from the first and second packets.

25 Claims, 19 Drawing Sheets

(56) References Cited

U.S. PATENT DOCUMENTS

| | | | | |
|---|---|---|---|---|
| 2012/0014433 A1* | 1/2012 | Karczewicz | ............ | H03M 7/40 |
| | | | | 375/E7.126 |
| 2014/0210652 A1* | 7/2014 | Bartnik | .................. | H03M 7/40 |
| | | | | 341/67 |
| 2016/0198218 A1* | 7/2016 | Kwon | ..................... | H04L 69/04 |
| | | | | 725/131 |
| 2017/0339453 A1* | 11/2017 | Kwon | ................ | H04N 21/4345 |
| 2020/0083983 A1* | 3/2020 | Chen | .................... | H04L 1/0068 |
| 2020/0336154 A1 | 10/2020 | Ovsiannikov | | |
| 2020/0382830 A1* | 12/2020 | Kwon | ................ | H04N 21/854 |

* cited by examiner

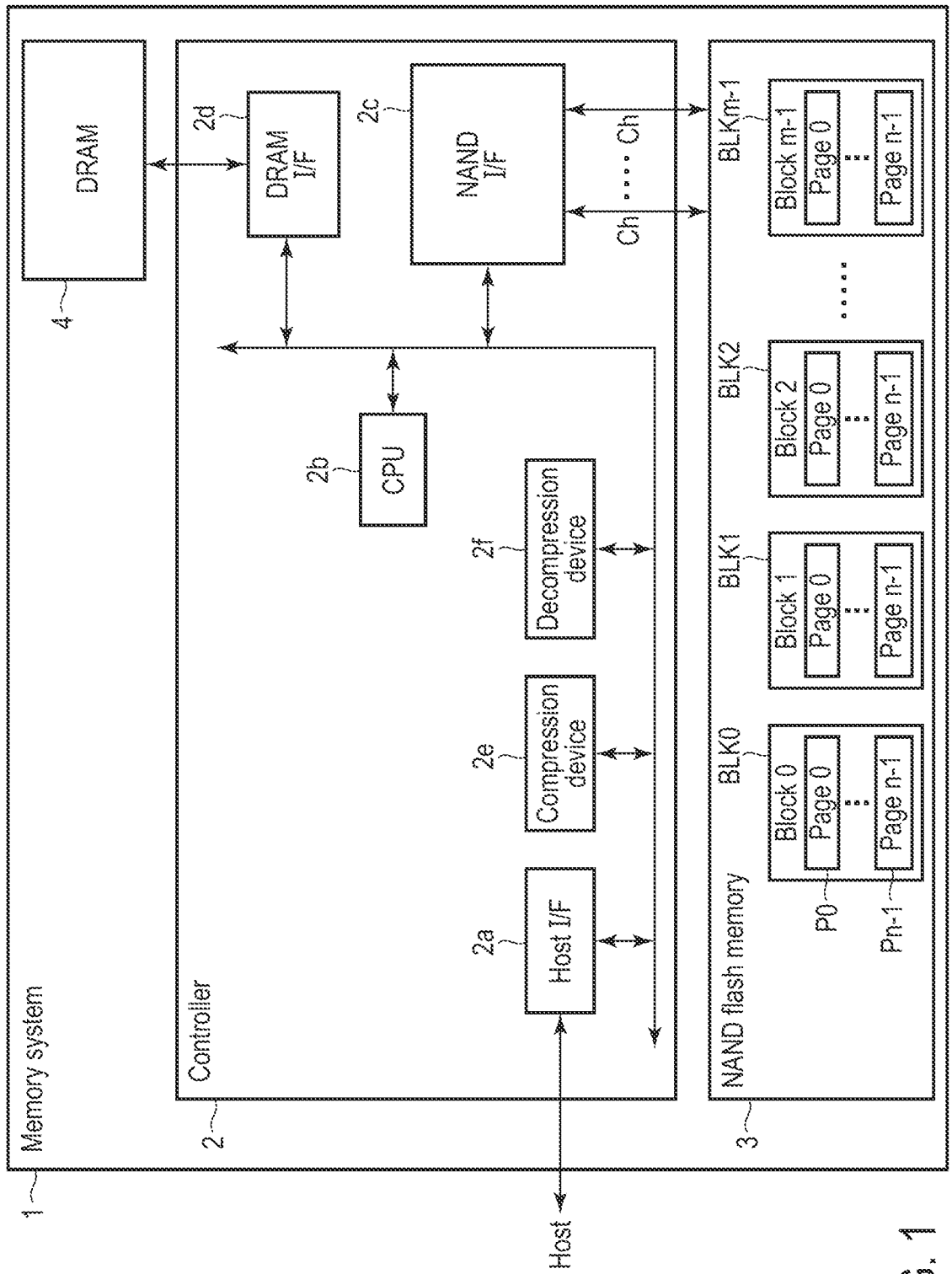
F I G. 1

| S0' | S2' | S4' | S6' |
|---|---|---|---|
| 5bit | 6bit | 13bit | 14bit |

FIG. 3

| S1' | S3' | S5' | S7' |
|---|---|---|---|
| 15bit | 10bit | 14bit | 14bit |

FIG. 4

| Cycle | C0 | C1 | C2 | C3 | C4 |
|---|---|---|---|---|---|
| Symbol | — | S0 | S2 | S4 | S6 |
| Code length (bit) | 0 | 5 | 6 | 13 | 14 |
| Remaining amount of packet buffer (bit) | 0 | 0+16=16 | 11+16=27 | 21 | 8+16=24 |
| Remaining amount of packet buffer (after decoding) (bit) | 0 | 16-5=11 | 27-6=21 | 21-13=8 | 24-14=10 |
| Packet request (bit) | 16 | 16 | 0 | 16 | 16 |

F I G. 5

| Cycle | C0 | C1 | C2 | C3 | C4 |
|---|---|---|---|---|---|
| Symbol | — | S1 | S3 | S5 | S7 |
| Code length (bit) | 0 | 15 | 10 | 14 | 14 |
| Remaining amount of packet buffer (bit) | 0 | 0+16=16 | 1+16=17 | 7+16=23 | 9+16=25 |
| Remaining amount of packet buffer (after decoding) | 0 | 16-15=1 | 17-10=7 | 23-14=9 | 25-14=11 |
| Packet request (bit) | 16 | 16 | 16 | 16 | 16 |

F I G. 6

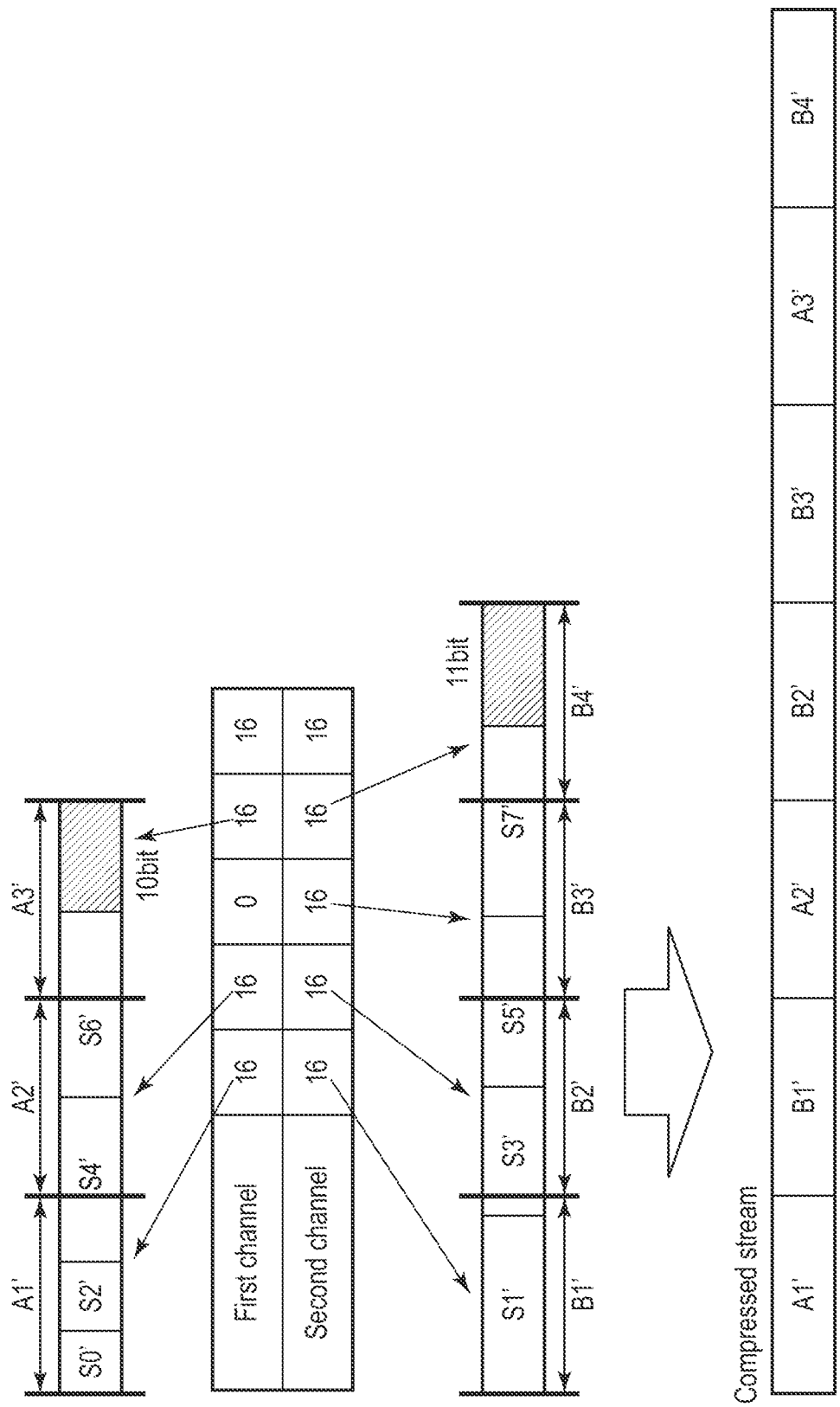
F I G. 7

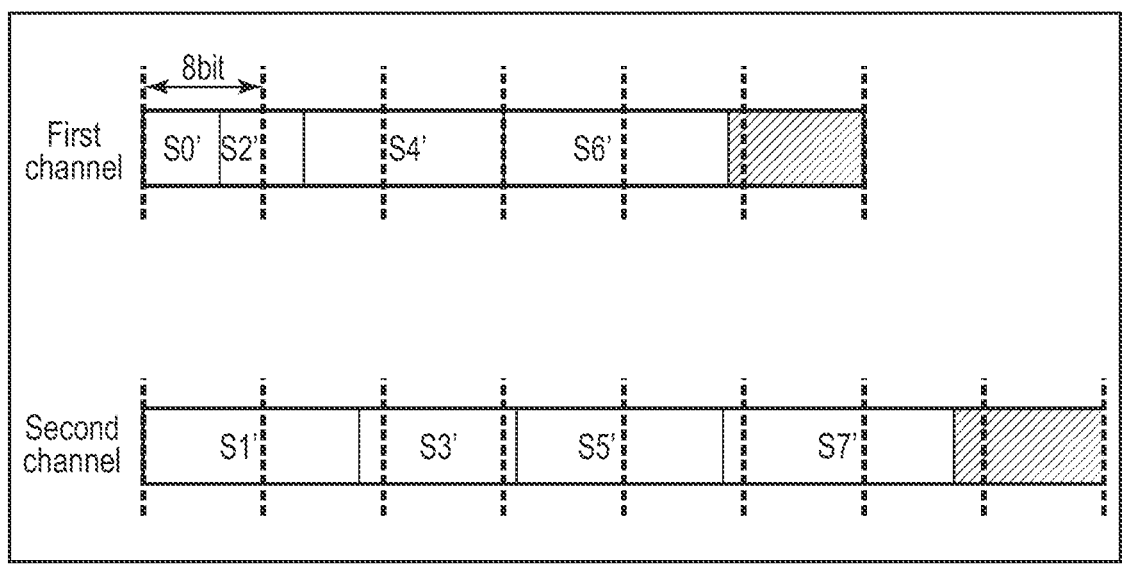
F I G. 8

| Cycle | C0 | C1 | C2 | C3 | C4 |
|---|---|---|---|---|---|
| Symbol | — | S0 | S2 | S4 | S6 |
| Code length (bit) | 0 | 5 | 6 | 13 | 14 |
| Remaining amount of packet buffer (bit) | 0 | 0+16=16 | 11+8=19 | 13+8=21 | 8+8=16 |
| Remaining amount of packet buffer (bit) (after decoding) | 0 | 16-5=11 | 19-6=13 | 21-13=8 | 16-14=2 |
| Packet request (bit) | 16 | 8 | 8 | 8 | 16 |

F I G. 9

| Cycle | C0 | C1 | C2 | C3 | C4 |
|---|---|---|---|---|---|
| Symbol | — | S1 | S3 | S5 | S7 |
| Code length (bit) | 0 | 15 | 10 | 14 | 14 |
| Remaining amount of packet buffer (bit) | 0 | 0+16=16 | 1+16=17 | 7+16=23 | 9+8=17 |
| Remaining amount of packet buffer (after decoding) | 0 | 16-15=1 | 17-10=7 | 23-14=9 | 17-14=3 |
| Packet request (bit) | 16 | 16 | 16 | 8 | 16 |

FIG. 10

| Cycle | C0 | C1 | C2 | C3 | C4 | C5 |
|---|---|---|---|---|---|---|
| Symbol | — | — | S0 | S2 | S4 | S6 |
| Code length (bit) | 0 | 0 | 5 | 6 | 13 | 14 |
| Remaining amount of packet buffer (bit) | 0 | 0+16→16 | 16+16→32 | 27 | 21+8=29 | 16+16=32 |
| Remaining amount of packet buffer (bit) (after decoding) | 0 | 16 | 32-5=27 | 27-6=21 | 29-13=16 | 32-14=18 |
| Packet request (bit) | 16 | 16 | 0 | 8 | 16 | 8 |

F I G. 12

| Cycle | C0 | C1 | C2 | C3 | C4 | C5 |
|---|---|---|---|---|---|---|
| Symbol | — | — | S1 | S3 | S5 | S7 |
| Code length (bit) | 0 | 0 | 15 | 10 | 14 | 14 |
| Remaining amount of packet buffer (bit) | 0 | 0+16→16 | 16+16→32 | 17+8→25 | 15+16→31 | 17+8→25 |
| Remaining amount of packet buffer (bit) (after decoding) | 0 | 16 | 32-15→17 | 25-10→15 | 31-14=17 | 25-14=11 |
| Packet request (bit) | 16 | 16 | 8 | 16 | 8 | 16 |

F I G. 13

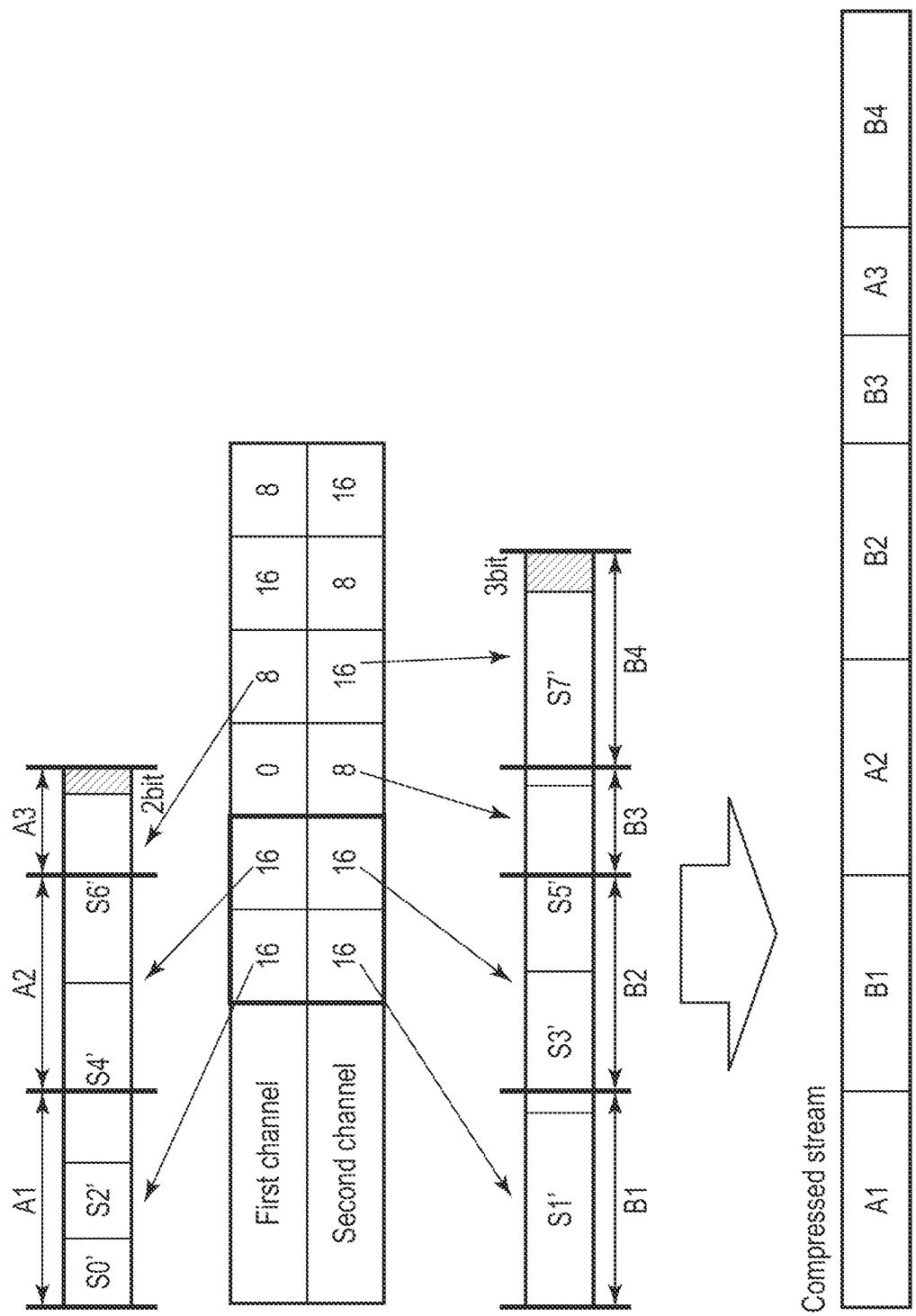
F I G. 14

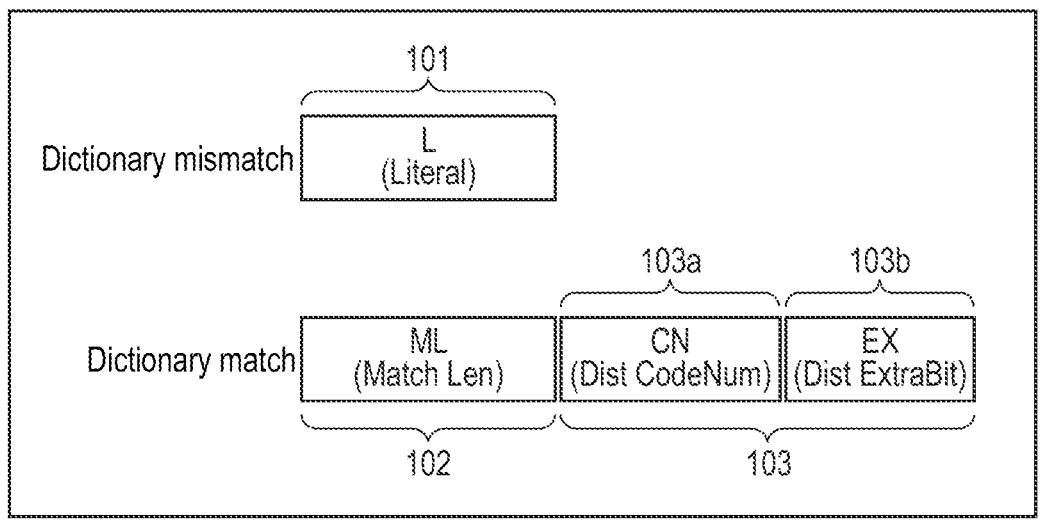
F I G. 17
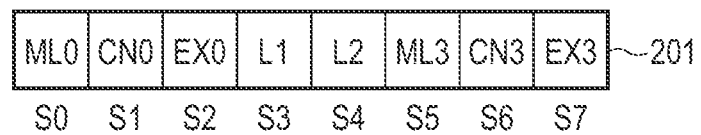
F I G. 18

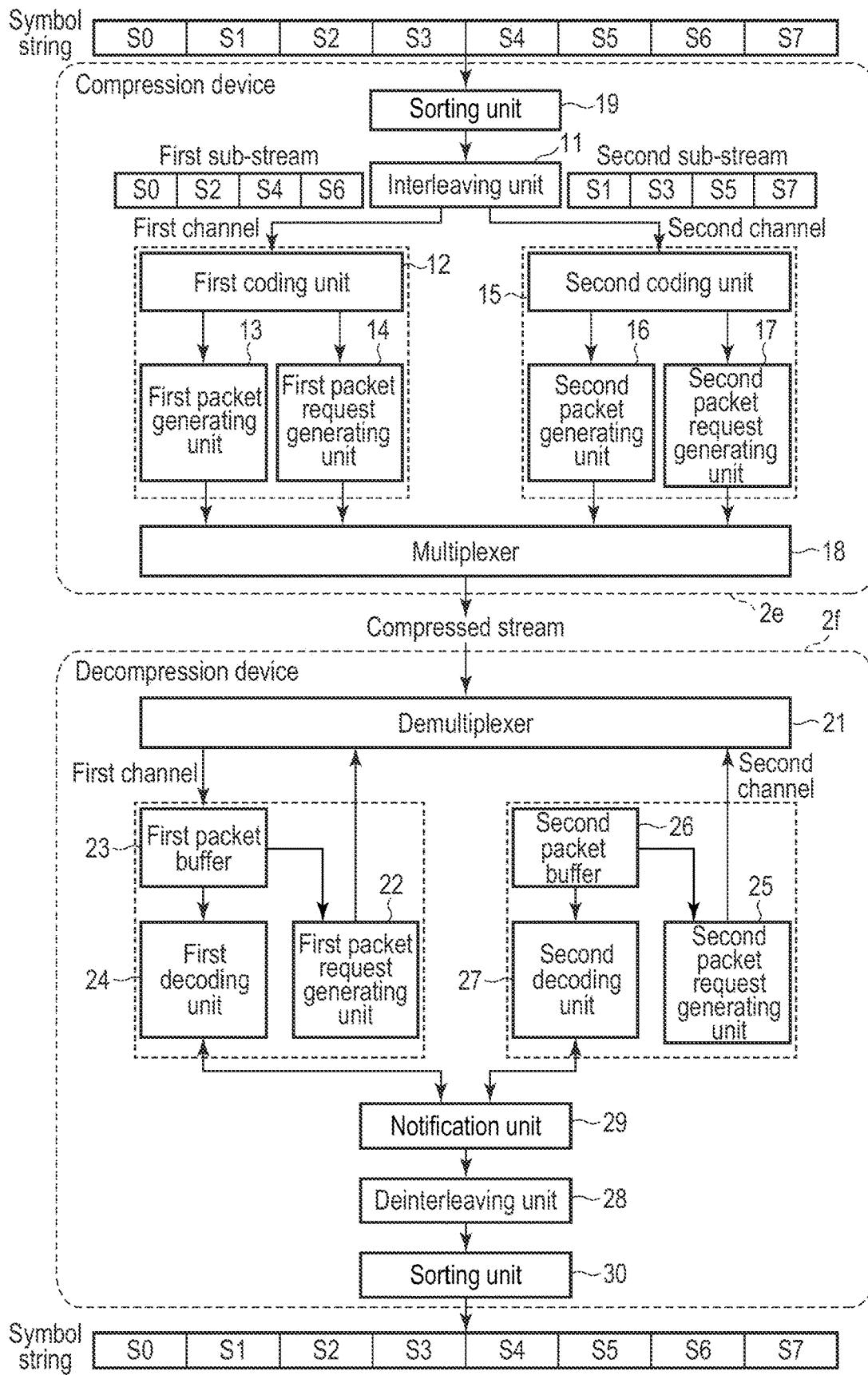
F I G. 19

|  | Channel 0 | Channel 1 | Channel 2 | Channel 3 | Channel 4 | Channel 5 | Channel 6 | Channel 7 |
|---|---|---|---|---|---|---|---|---|
| Cycle 0 | L0 | ML1 | L2 | L3 | ML4 | ML5 | L6 | L7 |
| Cycle 1 | CN1 | EX1 | CN4 | EX4 | CN5 | EX5 | ML8 | L9 |
| Cycle 2 | CN8 | EX8 |  |  |  |  |  |  |

F I G. 23

US 11,742,876 B2

COMPRESSION DEVICE AND DECOMPRESSION DEVICE

CROSS-REFERENCE TO RELATED APPLICATIONS

This application is based upon and claims the benefit of priority from Japanese Patent Application No. 2021-110809, filed Jul. 2, 2021, the entire contents of which are incorporated herein by reference.

FIELD

Embodiments described herein relate generally to a compression device and a decompression device.

BACKGROUND

In recent years, for example, when a write command is issued from a host, the write data is compressed by a compression device and written to a non-volatile memory, and when a read command is issued from the host, the read data read from the non-volatile memory is decompressed by a decompression device and returned to the host. With this operation, the storage area of the non-volatile memory can be effectively utilized.

Meanwhile, in a case where entropy coding is performed to compress the write data, the expected compression efficiency (the expected effect) cannot be obtained in some cases.

BRIEF DESCRIPTION OF THE DRAWINGS

FIG. 1 is a block diagram schematically illustrating an example of a hardware configuration of a memory system to which a compression device and a decompression device according to a first embodiment are applied.

FIG. 3 is a diagram illustrating an example of a plurality of codewords converted from a first sub-stream in the first embodiment.

FIG. 4 is a diagram illustrating an example of a plurality of codewords converted from a second sub-stream in the first embodiment.

FIG. 5 is a diagram illustrating a specific example of an operation of a first channel in a decompression device according to a comparative example of the first embodiment.

FIG. 6 is a diagram illustrating a specific example of an operation of a second channel in the decompression device according to the comparative example of the first embodiment.

FIG. 7 is a diagram for explaining the outline of an operation of a first packet request generating unit, a second packet request generating unit, and a multiplexer included in a compression device according to the comparative example of the first embodiment.

FIG. 8 is a diagram illustrating the outline of variable length packets included in a compressed stream output from the compression device according to the first embodiment.

FIG. 9 is a diagram illustrating a specific example of an operation of the first channel in the decompression device according to the first embodiment.

FIG. 10 is a diagram illustrating a specific example of an operation of the second channel in the decompression device according to the first embodiment.

FIG. 12 is a diagram illustrating a specific example of an operation of a first channel in a decompression device according to a second embodiment.

FIG. 13 is a diagram illustrating a specific example of an operation of a second channel in the decompression device according to the second embodiment.

FIG. 14 is a diagram for explaining the outline of an operation of a first packet request generating unit, a second packet request generating unit, and a multiplexer included in a compression device according to the second embodiment.

FIG. 17 is a diagram for explaining a result of dictionary coding in a third embodiment.

FIG. 18 is a diagram illustrating an example of a symbol string in the third embodiment.

FIG. 19 is a diagram illustrating an example of a configuration of a compression device and a decompression device according to the third embodiment.

FIG. 23 is a diagram for explaining an operation of the notification unit in the case where the number of channels is eight in the third embodiment.

DETAILED DESCRIPTION

Figure 2:
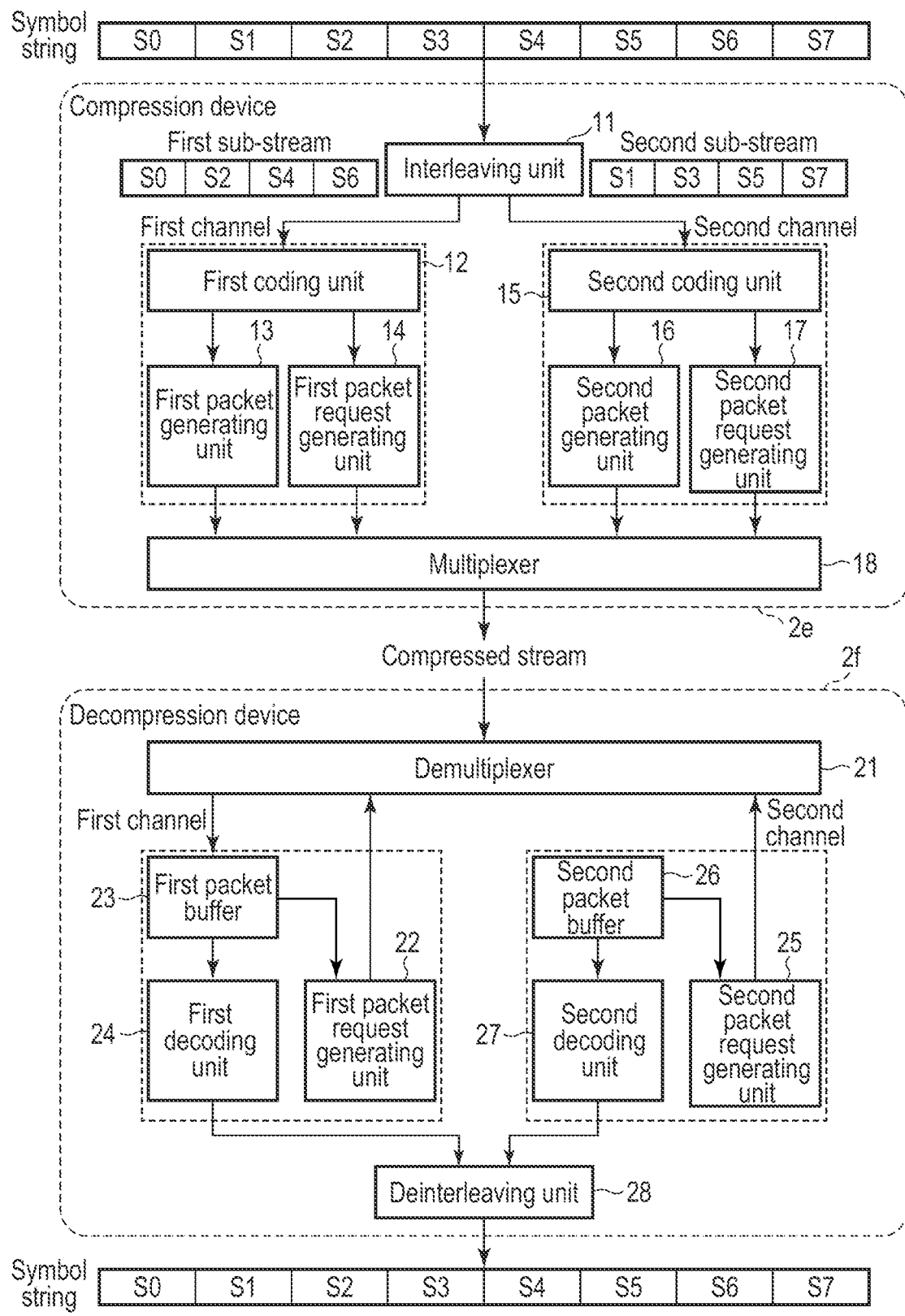
FIG. 2 is a diagram illustrating an example of a configuration of the compression device and the decompression device according to the first embodiment.

Hereinafter, embodiments will be described with reference to the drawings.

In general, according to one embodiment, a compression device includes an interleaving unit, a first coding unit, a first packet generating unit, a first request generating unit, a second coding unit, a second packet generating unit, a second request generating unit, and a multiplexer. The interleaving unit is configured to divide a symbol string which is input into a plurality of first symbols and a plurality of second symbols different from the first symbols. The first coding unit is configured to perform coding on the first symbols to convert the first symbols to a plurality of first codewords. The first packet generating unit is configured to generate first packets, the first packets including the first codewords. The first request generating unit is configured to generate first packet requests including sizes of variable length packets based on code length of each of the first codewords. The second coding unit is configured to perform coding on the second symbols to convert the second symbols to a plurality of second codewords. The second packet generating unit is configured to generate second packets, the second packets including the second codewords. The second request generating unit is configured to generate second packet requests including sizes of variable length packets based on code length of each of the second codewords. The multiplexer is configured to cut out first variable length packets from the first packets based on the sizes of the variable length packets included in the first packet requests, cut out second variable length packets from the second packets based on the sizes of the variable length packets included in the second packet requests, and output a compressed stream including the first and second variable length packets.

First Embodiment

First, a first embodiment will be described. FIG. 1 is a block diagram schematically illustrating an example of a hardware configuration of a memory system to which a compression device and a decompression device according to the first embodiment are applied.

A memory system 1 illustrated in FIG. 1 is a semiconductor storage device configured to write data to a non-volatile memory and read data from the non-volatile memory. In the present embodiment, the memory system 1 is described as being implemented as, for example, a solid state drive (SSD), but the memory system 1 can be another storage device.

The memory system 1 is configured to be connectable to a host via a system bus such as a PCI Express bus. As illustrated in FIG. 1, the memory system 1 includes a controller 2, a NAND flash memory 3, a dynamic random access memory (DRAM) 4, and the like.

The controller 2 has a function of controlling the operation of the memory system 1. The controller 2 includes a host interface (I/F) 2a, a CPU 2b, a NAND interface (I/F) 2c, a DRAM interface (I/F) 2d, and the like. The host interface 2a, the CPU 2b, the NAND interface (I/F) 2c, and the DRAM interface 2d are connected to each other via, for example, a bus.

The host interface 2a is a host interface circuit configured to perform communication with a host located outside the memory system 1. The host interface 2a can be, for example, a PCI Express controller or the like. The host interface 2a receives various commands (requests) from the host.

The CPU 2b is a processor configured to control the host interface 2a, the NAND interface 2c, and the DRAM interface 2d. The CPU 2b performs various processes by loading a control program (firmware) from the NAND flash memory 3 or a rea only memory (ROM) (not illustrated) into the DRAM 4 in response to the power-on of the memory system 1, and executing the control program. Specifically, the CPU 2b performs processes for various commands issued from the host. Note that all or part of the processes for the commands issued from the host can be executed by dedicated hardware in the controller 2.

The NAND interface 2c is a memory control circuit configured to control the NAND flash memory 3 under the control of the CPU 2b.

In addition, the controller 2 includes a compression device 2e (an encoder) and a decompression device 2f (a decoder).

In a case where a write command is issued from the hose, for example, the compression device 2e is used to input data (write data) specified in the write command and compress the data. Note that the compression device 2e according to the present embodiment is only required to perform at least entropy coding, but in the present embodiment, it is assumed that the scheme of compressing data by, for example, a compression algorithm combining dictionary coding and entropy coding is adopted. The data compressed in the compression device 2e (hereinafter, referred to as "compressed data") is output from the compression device 2e, and then subjected to predetermined processes such as an error correction process and a randomization process. The CPU 2b writes the data obtained by performing the predetermined processes on the compressed data to the NAND flash memory 3 via the NAND interface 2c. That is, the CPU 2b writes the data based on the compressed data output from the compression device 2e to the NAND flash memory 3.

When reading the compressed data from the NAND flash memory 3 based on a read command received from the host via the host interface 2a, for example, the CPU 2b reads the data based on the read command from the NAND flash memory 3 via the NAND interface 2c. The data read from the NAND flash memory 3 is subjected to predetermined processes such as an error correction process and a randomization cancellation process, and then is input to the decompression device 2f by the CPU 2b as compressed data. The decompression device 2f decompresses the input compressed data. That is, the decompression device 2f decompresses the compressed data based on the data read from the NAND flash memory 3.

The NAND flash memory 3 is a non-volatile memory and has a memory cell array including a plurality of memory cells arranged in a matrix. The NAND flash memory 3 can be a NAND flash memory with a two-dimensional structure or can be a NAND flash memory with a three-dimensional structure.

The memory cell array of the NAND flash memory 3 includes a plurality of blocks BLK0 to BLKm−1. Each of the blocks BLK0 to BLKm−1 includes a large number of pages (here, pages P0 to Pn−1). The blocks BLK0 to BLKm−1 function as erase units. Each of the pages P0 to Pn−1 includes a plurality of memory cells connected to the same word line. The pages P0 to Pn−1 are units of a data write operation and a data read operation.

Here, the memory system 1 has been described as including the NAND flash memory 3, but the memory system 1 can be configured to include, for example, a phase change memory (PCM) or a magnetoresistive random access memory (MRAM) as a non-volatile memory.

The DRAM 4 is a volatile memory, and functions as, for example, a temporary buffer of software executed in the controller 2 (the CPU 2b), a temporary buffer for the NAND flash memory 3, or the like.

Although the memory system 1 has been described here as including the DRAM 4, the memory system 1 can be configured to include, for example, a static random access memory (SRAM) as a volatile memory.

Note that the compression device 2e and the decompression device 2f have been described as being incorporated in the controller 2 in FIG. 1, but the compression device 2e and the decompression device 2f can be provided outside the controller 2 or can be provided outside the memory system 1.

Furthermore, in the present embodiment, the compression device 2e and the decompression device 2f are described as being implemented by hardware, but all or part of the compression device 2e and the decompression device 2f can be implemented by software, or can be implemented by a combination of software and hardware.

Hereinafter, an example of the configuration of the compression device 2e and the decompression device 2f illustrated in FIG. 1 will be described with reference to FIG. 2.

Here, it is assumed in the present embodiment that the compression device 2e is configured to compress write data (hereinafter, referred to as "uncompressed data") input to the compression device 2e by the compression algorithm combining dictionary coding and entropy coding as described above.

In this case, the compression device 2e performs dictionary coding on the uncompressed data and then entropy coding on the result of dictionary coding, thereby outputting compressed data in which the uncompressed data is compressed.

Note that dictionary coding is a coding method that converts data to be subjected to dictionary coding (hereinafter referred to as "dictionary coding target data") to a relative reference of data older than the dictionary coding target data.

Specifically, in dictionary coding, a buffer for storing past data (hereinafter referred to as "history buffer") is prepared, and the past data matching the dictionary coding target data is searched in the history buffer.

In a case where the past data matching the dictionary coding target data is not present in the history buffer, the information indicating the dictionary coding target data (hereinafter referred to as "literal information") is output as the result of dictionary coding.

On the other hand, in a case where the past data matching the dictionary coding target data is present in the history buffer, a set of the information indicating the length at which the dictionary coding target data matches the past data in the history buffer (hereinafter referred to as "match length information") and the information (hereinafter referred to as "distance information") indicating the position in the history buffer where the past data is stored (that is, the distance to the past data in the history buffer) is output as the result of dictionary encoding.

Entropy coding is a coding method that converts data to be subjected to entropy coding (hereinafter referred to as "entropy coding target data") to a codeword with a code length depending on the frequency of appearance of the entropy coding target data. According to entropy coding, codewords with different code lengths are assigned to the entropy coding target data by utilizing the difference in the appearance frequency of the entropy coding target data, so that the amount of codes (the amount of data) can be reduced as a whole.

For example, Huffman coding is used as entropy coding. In a case where Huffman coding is used as entropy coding, Huffman coding can be static Huffman coding that performs coding by using a pre-constructed code tree, or can be dynamic Huffman coding that changes a code tree depending on Huffman coding target data. For example, arithmetic coding or the like can be used as entropy coding.

In a case where the compression device 2e is configured to perform entropy coding on the result of dictionary coding as described above, for example, the compression device 2e performs dictionary coding by using each piece of data partially cut out from the uncompressed data input to the compression device 2e as the dictionary coding target data, and performs entropy coding by using pieces of the literal information, the match length information, and the distance information, which are the result of dictionary coding, as the entropy coding target data.

Note that in entropy coding, the entropy coding target data (for example, the literal information, the match length information, and the distance information) is referred to as "symbol", and in a case where entropy coding is performed, a symbol string including the literal information, the match length information, and the distance information sequentially arranged as the result of dictionary coding is input.

It is described in the present embodiment that the result of dictionary coding (the literal information, the match length information, and the distance information) is input as a symbol and entropy coding is performed, but the compression device 2e according to the present embodiment can be configured to perform entropy coding by inputting information in another format as a symbol.

As illustrated in FIG. 2, the compression device 2e includes an interleaving unit 11, a first coding unit 12, a first packet generating unit 13, a first packet request generating unit 14, a second coding unit 15, and a second packet generating unit 16, a second packet request generating unit 17, and a multiplexer 18. Note that FIG. 2 illustrates only the configuration of the compression device 2e in which entropy coding is performed, and the configuration of the compression device 2e in which dictionary coding is performed is omitted.

Here, in entropy coding performed in the compression device 2e of the present embodiment, the interleaved storage scheme is adopted in order to implement high-throughput entropy decoding (that is, decompression of compressed data) in the decompression device 2f to be described later. In this interleaved storage scheme, when coding is performed on the symbol string, a plurality of symbols included in the symbol string are distributed to a plurality of channels, a packet is generated from the result of coding in each of the channels (that is, a codeword), and a compressed stream containing the packet is output as compressed data.

According to such an interleaved storage scheme, decoding is performed in parallel on a plurality of channels also in the decompression device 2f to be described later, and thus high-throughput entropy decoding can be implemented.

The interleaving unit 11 inputs the symbol string and distributes the symbol string to a plurality of channels (that is, divides the symbol string into a plurality of channels). In this case, each of the symbols included in the symbol string is distributed to one of the channels.

Here, it is assumed that the interleaving unit 11 distributes the symbol string to two channels (hereinafter, referred to as "first channel" and "second channel"). In the example illustrated in FIG. 2, the first coding unit 12, the first packet generating unit 13, and the first packet request generating unit 14 correspond to the first channel, and the second coding unit 15, the second packet generating unit 16, and the second packet request generating unit 17 correspond to the second channel.

Note that in the example illustrated in FIG. 2, the symbol string in which the symbols S0 to S7 are arranged in order is input to the interleaving unit 11, and the symbols S0, S2, S4 and S6 in the symbol string are distributed to the first channel, the symbols S1, S3, S5 and S7 are distributed to the second channel. Here, the even-numbered symbols in the symbol string are distributed to the first channel, and the odd-numbered symbols are distributed to the second channel, but the symbol string can be distributed according to another rule.

Hereinafter, in the symbol string input to the interleaving unit 11, a plurality of symbols distributed to the first channel are referred to as "first sub-stream", and a plurality of symbols distributed to the second channel are referred to as "second sub-stream".

The first coding unit 12 inputs the first sub-stream distributed to the first channel, and performs entropy coding on each of the symbols constituting the first sub-stream. As a result, each of the symbols constituting the first sub-stream is converted to a codeword. Since entropy coding is variable length coding, the codewords converted from the symbols constituting the first sub-stream have different code lengths. The first coding unit 12 outputs the codewords converted from the symbols constituting the first sub-stream to the first packet generating unit 13, and outputs the code lengths of the codewords to the first packet request generating unit 14.

The first packet generating unit 13 buffers the codewords output from the first coding unit 12 and generates packets including the buffered codewords. The first packet generating unit 13 outputs the generated packets to the multiplexer 18.

The first packet request generating unit 14 generates packet requests to arrange the packets generated by the first packet generating unit 13 in a compressed stream in a predetermined order, for example, based on the code length of each of the codewords output from the first coding unit 12. Note that in a case where entropy decoding is performed in the first and second channels in the decompression device 2f, the first packet request generating unit 14 generates packet requests to arrange the packets in the acquisition order in response to the packet requests generated by a first packet request generating unit 22 in the compressed stream. The first packet request generating unit 14 outputs the generated packet requests to the multiplexer 18.

The second coding unit 15 inputs the second sub-stream distributed to the second channel, and performs entropy coding on each of the symbols constituting the second sub-stream. As a result, each of the symbols constituting the second sub-stream is converted to a codeword. Since entropy coding is variable length coding as described above, the codewords converted from the symbols constituting the second sub-stream have different code lengths. The second coding unit 15 outputs the codewords converted from the symbols constituting the second sub-stream to the second packet generating unit 16, and outputs the code lengths of the codewords to the second packet request generating unit 17.

The second packet generating unit 16 buffers the codewords output from the second coding unit 15 and generates packets including the buffered codewords. The second packet generating unit 16 outputs the generated packets to the multiplexer 18.

The second packet request generating unit 17 generates packet requests to arrange the packets generated by the second packet generating unit 16 in the compressed stream in a predetermined order, for example, based on the code length of each of the codewords output from the second coding unit 15. In a case where entropy decoding is performed in the first and second channels in the decompression device 2f, the second packet request generating unit 17 generates packet requests to arrange the packets in the acquisition order in response to the packet requests generated by the second packet request generating unit 25 in the compressed stream. The second packet request generating unit 17 outputs the generated packet requests to the multiplexer 18.

Note that the first channel (the first coding unit 12, the first packet generating unit 13, and the first packet request generating unit 14) and the second channel (the second coding unit 15, the second packet generating unit 16, and the second packet request generating unit 17) in the compression device 2e operate in parallel based on the same processing unit referred to as "cycle".

The multiplexer 18 selects the packets output from the first packet generating unit 13 based on the packet requests output from the first packet request generating unit 14, selects the packets output from the second packet generating unit 16 based on the packet requests output from the second packet request generating unit 17, and outputs the compressed stream in which the selected packets are sequentially arranged (that is, including the packets) as compressed data.

Note that the compressed stream output from the multiplexer 18 is written to the NAND flash memory 3 after predetermined processes such as the error correction process and the randomization process are performed.

As illustrated in FIG. 2, the decompression device 2f includes a demultiplexer 21, the first packet request generating unit 22, a first packet buffer 23, a first decoding unit 24, the second packet request generating unit 25, a second packet buffer 26, a second decoding unit 27, and a deinterleaving unit 28.

Note that in a case where the compression device 2e compresses uncompressed data by the compression algorithm combining dictionary coding and entropy coding, the decompression device 2f has to perform entropy decoding on the compressed data and dictionary coding on the result of entropy decoding, but FIG. 2 illustrates only the configuration of the decompression device 2f in which entropy decoding is performed, and the configuration in which dictionary decoding is omitted.

For example, the demultiplexer 21 inputs a compressed stream (compressed data) after predetermined processes such as the error correction process and the randomization cancellation process are performed on the read data read from the NAND flash memory 3. The demultiplexer 21 sequentially cuts out packets from the head of the input compressed stream, and outputs the cut out packets to the first channel and the second channel.

Note that in the example illustrated in FIG. 2, the first packet request generating unit 22, the first packet buffer 23, and the first decoding unit 24 correspond to the first channel, and the second packet request generating unit 25, the second packet buffer 26, and the second decoding unit 27 correspond to the second channel.

The first packet request generating unit 22 generates packet requests based on the state of the first packet buffer 23 and the like. The first packet request generating unit 22 outputs the generated packet requests to the demultiplexer 21.

In this case, the packets output from the demultiplexer 21 in response to the packet requests generated by the first packet request generating unit 22 is stored in the first packet buffer 23.

The first decoding unit 24 performs entropy decoding on the packets (the codewords included in the packets) stored in the first packet buffer 23. As a result, the codewords included in the packets are converted to symbols. The first decoding unit 24 outputs the symbols converted from the codewords included in the packets to the deinterleaving unit 28.

The second packet request generating unit 25 generates packet requests based on the state of the second packet buffer 26 and the like. The second packet request generating unit 25 outputs the generated packet requests to the demultiplexer 21.

In this case, the packets output from the demultiplexer 21 in response to the packet requests generated by the second packet request generating unit 25 is stored in the second packet buffer 26.

The second decoding unit 27 performs entropy decoding on the packets (the codewords included in the packets) stored in the second packet buffer 26. As a result, the codewords included in the packets are converted to symbols. The second decoding unit 27 outputs the symbols converted from the codewords included in the packets to the deinterleaving unit 28.

Note that the first channel (the first packet request generating unit 22, the first packet buffer 23, and the first decoding unit 24) and the second channel (the second packet request generating unit 25, the second packet buffer 26, and the second decoding unit 27) in the decompression device 2f operate in parallel based on the same processing unit referred to as "cycle".

The deinterleaving unit 28 outputs a symbol string including the symbols output from the first decoding unit 24 and the symbols output from the second decoding unit 27.

Hereinafter, an example of an operation of a compression device and a decompression device according to a comparative example of the present embodiment will be described. Here, the compression device and the decompression device according to the comparative example of the present embodiment will be described as having the configuration similar to that of FIG. 2 described above.

Note, however, that in order to clearly distinguish the description of the compression device 2e according to the present embodiment and the description of the compression device according to the comparative example of the present embodiment, the interleaving unit, the first coding unit, the first packet generating unit, the first packet request generating unit, the second coding unit, the second packet generating unit, the second packet request generating unit, and the multiplexer, which are included in the compression device according to the comparative example of the present embodiment, are described as an interleaving unit 11', a first coding unit 12', a first packet generating unit 13', a first packet request generating unit 14', a second coding unit 15', a second packet generating unit 16', a second packet request generating unit 17', and a multiplexer 18', respectively for the sake of convenience.

Similarly, the demultiplexer, the first packet request generating unit, the first packet buffer, the first decoding unit, the second packet request generating unit, the second packet buffer, the second decoding unit, and the deinterleaving unit included in the decompression device according to the comparative example of the present embodiment are described as a demultiplexer 21', a first packet request generating unit 22', a first packet buffer 23', a first decoding unit 24', a second packet request generating unit 25', a second packet buffer 26', a second decoding unit 27', and a deinterleaving unit 28', respectively for the sake of convenience.

Further, the compression device and the decompression device according to the comparative example of the present embodiment are described as a compression device 2e' and a decompression device 2f' for the sake of convenience.

First, it is assumed that a symbol string S0 to S7 is input to the interleaving unit 11', and the symbol string S0 to S7 is divided into a first sub-stream (the symbols S0, S2, S4, and S6) and a second sub-stream (the symbols S1, S3, S5, and S7). In the following description, it is assumed that one symbol is represented by, for example, 16 bits.

The first sub-stream divided by the interleaving unit 11' is distributed to a first channel (the first coding unit 12'), and the second sub-stream is distributed to a second channel (the second coding unit 15').

In the first channel, the first coding unit 12' inputs the first sub-stream distributed by the interleaving unit 11', and converts each of a plurality of symbols constituting the first sub-stream into codewords.

Here, FIG. 3 illustrates an example of a plurality of codewords converted from the first sub-stream (a plurality of symbols constituting the first sub-stream). The example illustrated in FIG. 3 shows that the symbols S0, S2, S4, and S6 constituting the first sub-stream are converted to codewords S0', S2', S4', and S6', respectively.

As described above, each symbol constituting the first sub-stream is represented by 16 bits, but the codeword S0' converted from the symbol S0 is assumed to be, for example, 5 bits. Similarly, it is assumed that the codeword S2' converted from the symbol S2 is, for example, 6 bits, the codeword S4' converted from the symbol S4 is, for example, 13 bits, and the codeword S6' converted from the symbol S6 is, for example, 14 bits.

In the first channel, packets including a plurality of codewords converted from the first sub-stream are generated by the first packet generating unit 13', and the packets are output to the multiplexer 18', as described above.

On the other hand, in the second channel, the second coding unit 15' inputs the second sub-stream distributed by the interleaving unit 11', and converts each of a plurality of symbols constituting the second sub-stream to a codeword.

Here, FIG. 4 illustrates an example of a plurality of codewords converted from the second sub-stream (a plurality of symbols constituting the second sub-stream). The example illustrated in FIG. 4 shows that the symbols S1, S3, S5, and S7 constituting the second sub-stream are converted to codewords S1', S3', S5', and S7', respectively.

As described above, each symbol constituting the second sub-stream is represented by 16 bits, but the codeword S1' converted from the symbol S1 is assumed to be, for example, 15 bits. Similarly, it is assumed that the codeword S3' converted from the symbol S3 is, for example, 10 bits, the codeword S5' converted from the symbol S5 is, for example, 14 bits, and the codeword S7' converted from the symbol S7 is, for example, 14 bits.

In the second channel, packets including a plurality of codewords converted from the second sub-stream are generated by the second packet generating unit 16', and the packets are output to the multiplexer 18', as described above.

Note that the first packet generating unit 13' and the second packet generating unit 16' described above are assumed to generate, for example, packets with a fixed length of 16 bits.

Next, the multiplexer 18' selects packets generated by the first packet generating unit 13' and the second packet generating unit 16' in response to the packet requests generated by the first packet request generating unit 14' and the second packet request generating unit 17', and generates a compressed stream in which the selected packets are sequentially arranged.

Here, while entropy decoding is performed in parallel on the first and second channels also on the side of the decompression device 2f' according to the comparative example of the present embodiment, as on the side of the compression device 2e', entropy decoding is performed on the packets (codewords included in the packets) sequentially stored in the first packet buffer 23' and the second packet buffer 26' in response to the packet requests generated by the first packet request generating unit 22' and the packet requests generated by the second packet request generating unit 25' in the decompression device 2f'.

Consequently, the first packet request generating unit 14' and the second packet request generating unit 17' included in the compression device 2e' generate packet requests so as to reproduce the operation of the first packet request generating unit 22' and the second packet request generating unit 25' that generate the packet request (that is, so as to reproduce the packet requests generated by the first packet request generating unit 22' and the second packet request generating unit 25'). The first packet request generating unit 22' and the second packet request generating unit 25' included in the decompression device 2f' generate packet requests based on the state of the first packet buffer 23' and the second packet buffer 26' at the time of performing entropy decoding.

As a result, the multiplexer 18' can generate a compressed stream in which the packets are arranged in the acquisition order in the first and second channels in the decompression device 2f'. In this case, a plurality of codewords (packets including the codewords) converted from the first sub-stream in the first channel of the compression device 2e' are subjected to entropy decoding in the first channel of the decompression device 2f', and a plurality of codewords (packets including the codewords) converted from the second sub-stream in the second channel of the compression device 2e are subjected to entropy decoding in the second channel of the decompression device 2f', so that the decompression device 2f' can obtain the correct symbol string from the compressed stream.

Hereinafter, the outline of an operation of the first packet request generating unit 22' included in the decompression device 2f' (that is, the first channel in the decompression device 2f') whose operation is reproduced by the first packet request generating unit 14 included in the compression device 2e' will be described.

The first channel in the decompression device 2f' generates a packet request (requests a packet from the demultiplexer 21') so that the packet stored in the first packet buffer 23' is not depleted and performs entropy decoding on the packet. Specifically, the first channel in the decompression device 2f' is assumed to generate a packet request in a case where the remaining amount of packets (packets data) stored in the first packet buffer 23' is less than the maximum code length in entropy coding, and perform entropy decoding on the codewords included in the packets in a case where the remaining amount of packets is more than or equal to the maximum code length. Such an operation in the first channel is performed every cycle, but by performing entropy decoding in a case where the remaining amount of packets is more than or equal to the maximum code length, for example, even if the code length of the codeword included in the packet is the maximum code length, decoding can be efficiently performed on the codeword in a single cycle.

FIG. 5 illustrates a specific example of an operation of the first channel in the decompression device 2f'. Here, it is assumed that each packet included in the compressed stream has a fixed length of 16 bits, and the first packet buffer 23' is empty (that is, the remaining amount of packets is zero) when the process of the first channel in the decompression device 2f' starts. Further, it is assumed that each symbol is represented by 16 bits, and the maximum code length in entropy coding is 16 bits, as described above.

First, as described above, the remaining amount of packets stored in the first packet buffer 23' is zero, which is less than the maximum code length, that is, 16 bits. For this reason, the first packet request generating unit 22' generates a packet request in a cycle C0 and outputs the packet request to the demultiplexer 21'.

In this case, in a cycle C1 following the cycle C0, the packet output from the demultiplexer 21' in response to the packet request output from the first packet request generating unit 22' in the cycle C0 (that is, the packet cut out from the compressed stream) is stored in the first packet buffer 23'.

As a result, the remaining amount of packets stored in the first packet buffer 23' is 16 bits, which is more than or equal to the maximum code length, that is, 16 bits. Consequently, the first decoding unit 24' performs entropy decoding on the codeword included in the packet stored in the first packet buffer 23' to convert the codeword to a symbol. In a case where the symbols S0, S2, S4, and S6 are converted to the codewords S0', S2', S4', and S6' in the first channel of the compression device 2e' as described in FIG. 3, the first decoding unit 24' converts the codeword S0' included in the packet stored in the first packet buffer 23' in cycle C1 to the symbol S0. In this way, it is assumed that one codeword can be converted to one symbol in one cycle on each channel in the decompression device 2f'.

Since the codeword S0' converted to the symbol S0 is 5 bits, 5 bits are processed out of the packets (16 bits) stored in the first packet buffer 23', and the remaining amount of packets stored in the first packet buffer 23' is 11 bits.

In this case, since the remaining amount of packets stored in the first packet buffer 23' is less than the maximum code length, that is, 16 bits, the first packet request generating unit 22' generates a packet request and outputs the packet request to the demultiplexer 21'.

In a cycle C2 following the cycle C1, the packet output from the demultiplexer 21' in response to the packet request output from the first packet request generating unit 22' in the cycle C1 is stored in the first packet buffer 23'.

As a result, the remaining amount of packets stored in the first packet buffer 23' is 27 bits (11 bits, which is the remaining amount of packets in the cycle C1+16 bits newly stored in the first packet buffer 23'), which is more than or equal to the maximum code length, that is, 16 bits. Consequently, the first decoding unit 24' performs entropy decoding on the codeword included in the packet stored in the first packet buffer 23' to convert the codeword to a symbol. In this case, the codeword S2' following the codeword S0' converted to the symbol S0 in the cycle C1 described above is converted to the symbol S2. Since the codeword S2' is 6 bits, 6 bits are processed out of the remaining amount of packets (27 bits) stored in the first packet buffer 23', and the remaining amount of packets stored in the first packet buffer 23' is 21 bits.

In this case, since the remaining amount of packets stored in the first packet buffer 23' is more than or equal to the maximum code length, that is, 16 bits, the first packet request generating unit 22' does not generate a packet request in the cycle C2.

In a cycle C3 following the cycle C2, the remaining amount of packets stored in the first packet buffer 23' is 21 bits, which is more than or equal to the maximum code length, that is, 16 bits. Consequently, the first decoding unit 24' performs entropy decoding on the codeword included in the packet stored in the first packet buffer 23' to convert the codeword to a symbol. In this case, the codeword S4' following the codeword S2' converted to the symbol S2 in the cycle C2 described above is converted to the symbol S4. Since the codeword S4' is 13 bits, 13 bits are processed out of the remaining amount of packets (21 bits) stored in the first packet buffer 23', and the remaining amount of packets stored in the first packet buffer 23' is 8 bits.

In this case, since the remaining amount of packets stored in the first packet buffer 23' is less than the maximum code length, that is, 16 bits, the first packet request generating unit 22' generates a packet request and outputs the packet request to the demultiplexer 21'.

In a cycle C4 following the cycle C3, the packet output from the demultiplexer 21' in response to the packet request output from the first packet request generating unit 22' in the cycle C3 is stored in the first packet buffer 23'.

As a result, the remaining amount of packets stored in the first packet buffer 23' is 24 bits (8 bits, which is the remaining amount of packets in the cycle C3+16 bits newly stored in the first packet buffer 23'), which is more than or equal to the maximum code length, that is, 16 bits. Consequently, the first decoding unit 24' performs entropy decoding on the codeword included in the packet stored in the first packet buffer 23' to convert the codeword to a symbol. In this case, the codeword S6' following the codeword S4' converted to the symbol S4 in the cycle C3 described above is converted to the symbol S6. Since the codeword S6' is 14 bits, 14 bits are processed out of the remaining amount of packets (24 bits) stored in the first packet buffer 23', and the remaining amount of packets stored in the first packet buffer 23' is 10 bits.

In this case, since the remaining amount of packets stored in the first packet buffer 23' is less than the maximum code length, that is, 16 bits, the first packet request generating unit 22' generates a packet request and outputs the packet request to the demultiplexer 21'.

It is assumed in the decompression device 2f' according to the comparative example of the present embodiment that the first packet request generating unit 22' generates a packet request as described above, and thus entropy decoding is sequentially performed on the packets (a plurality of codewords included in the packets) included in the compressed stream output from the compression device 2e'.

Here, although the operation of the first packet request generating unit 22' included in the decompression device 2f' (the first channel in the decompression device 2f') has been described, a similar operation is performed by the second packet request generating unit 25' included in the decompression device 2f' (that is, the second channel in the decompression device 2f').

The second channel in the decompression device 2f' generates a packet request (requests a packet from the demultiplexer 21') so that the packet stored in the second packet buffer 26' is not depleted and performs entropy decoding on the packet. Specifically, the second channel in the decompression device 2f' is assumed to generate a packet request in a case where the remaining amount of packets stored in the second packet buffer 26' is less than the maximum code length in entropy coding, and perform entropy decoding on the codewords included in the packets in a case where the remaining amount of packets is more than or equal to the maximum code length. Note that such an operation in the second channel is performed every cycle as in the case of the first channel described above.

FIG. 6 illustrates a specific example of an operation of the second channel in the decompression device 2f'. Here, it is assumed that each packet included in the compressed stream has a fixed length of 16 bits, and the second packet buffer 26' is empty (that is, the remaining amount of packets is zero) when the process of the second channel in the decompression device 2f' starts. Further, it is assumed that the maximum code length in entropy coding is 16 bits as described above.

First, as described above, the remaining amount of packets stored in the second packet buffer 26' is zero, which is less than the maximum code length, that is, 16 bits. For this reason, the second packet request generating unit 25' generates a packet request in the cycle C0 and outputs the packet request to the demultiplexer 21'.

In this case, in the cycle C1 following the cycle C0, the packet output from the demultiplexer 21' in response to the packet request output from the second packet request generating unit 25' in the cycle C0 (that is, the packet cut out from the compressed stream) is stored in the second packet buffer 26'.

As a result, the remaining amount of packets stored in the second packet buffer 26' is 16 bits, which is more than or equal to the maximum code length, that is, 16 bits. Consequently, the second decoding unit 27' performs entropy decoding on the codeword included in the packet stored in the second packet buffer 26' to convert the codeword to a symbol. In a case where the symbols S1, S3, S5, and S7 are converted to the codewords S1', S3', S5', and S7' in the second channel of the compression device 2e' as described in FIG. 4, the second decoding unit 27' converts the codeword S1' included in the packet stored in the second packet buffer 26' in cycle C1 in the symbol S1. Since the codeword S1' converted to the symbol S1 is 15 bits, 15 bits are processed out of the packets (16 bits) stored in the second packet buffer 26', and the remaining amount of packets stored in the second packet buffer 26' is 1 bit.

In this case, since the remaining amount of packets stored in the second packet buffer 26' is less than the maximum code length, that is, 16 bits, the second packet request generating unit 25' generates a packet request and outputs the packet request to the demultiplexer 21'.

In the cycle C2 following the cycle C1, the packet output from the demultiplexer 21' in response to the packet request output from the second packet request generating unit 25' in the cycle C1 is stored in the second packet buffer 26'.

As a result, the remaining amount of packets stored in the second packet buffer 26' is 17 bits (1 bit, which is the remaining amount of packets in the cycle C1+16 bits newly stored in the second packet buffer 26'), which is more than or equal to the maximum code length, that is, 16 bits. Consequently, the second decoding unit 27' performs entropy decoding on the codeword included in the packet stored in the second packet buffer 26' to convert the codeword to a symbol. In this case, the codeword S3' following the codeword S1' converted to the symbol S1 in the cycle C1 described above is converted to the symbol S3. Since the codeword S3' is 10 bits, 10 bits are processed out of the remaining amount of packets (17 bits) stored in the second packet buffer 26', and the remaining amount of packets stored in the second packet buffer 26' is 7 bits.

In this case, since the remaining amount of packets stored in the second packet buffer 26' is less than the maximum code length, that is, 16 bits, the second packet request generating unit 25' generates a packet request and outputs the packet request to the demultiplexer 21'.

In the cycle C3 following the cycle C2, the packet output from the demultiplexer 21' in response to the packet request output from the second packet request generating unit 25' in the cycle C2 is stored in the second packet buffer 26'.

As a result, the remaining amount of packets stored in the second packet buffer 26' is 23 bits (7 bits, which is the remaining amount of packets in the cycle C2+16 bits newly stored in the second packet buffer 26'), which is more than or equal to the maximum code length, that is, 16 bits. Consequently, the second decoding unit 27' performs entropy decoding on the codeword included in the packet stored in the second packet buffer 26' to convert the codeword to a symbol. In this case, the codeword S5' following the codeword S3' converted to the symbol S3 in the cycle C2 described above is converted to the symbol S5. Since the codeword S5' is 14 bits, 14 bits are processed out of the remaining amount of packets (23 bits) stored in the second packet buffer 26', and the remaining amount of packets stored in the second packet buffer 26' is 9 bits.

In this case, since the remaining amount of packets stored in the second packet buffer 26' is less than the maximum code length, that is, 16 bits, the second packet request generating unit 25' generates a packet request and outputs the packet request to the demultiplexer 21'.

In the cycle C4 following the cycle C3, the packet output from the demultiplexer 21' in response to the packet request output from the second packet request generating unit 25' in the cycle C3 is stored in the second packet buffer 26'.

As a result, the remaining amount of packets stored in the second packet buffer 26' is 25 bits (9 bits, which is the remaining amount of packets in the cycle C3+16 bits newly stored in the second packet buffer 26'), which is more than or equal to the maximum code length, that is, 16 bits. Consequently, the second decoding unit 27' performs entropy decoding on the codeword included in the packet stored in the second packet buffer 26' to convert the codeword to a symbol. In this case, the codeword S7' following the codeword S5' converted to the symbol S5 in the cycle C3 described above is converted to the symbol S7. Since the codeword S7' is 14 bits, 14 bits are processed out of the remaining amount of packets (25 bits) stored in the second packet buffer 26', and the remaining amount of packets stored in the second packet buffer 26' is 11 bits.

In this case, since the remaining amount of packets stored in the second packet buffer 26' is less than the maximum code length, that is, 16 bits, the second packet request generating unit 25' generates a packet request and outputs the packet request to the demultiplexer 21'.

It is assumed in the decompression device 2f according to the comparative example of the present embodiment that the second packet request generating unit 25' generates a packet request as described above, and thus entropy decoding is sequentially performed on the packets (a plurality of codewords included in the packets) included in the compressed stream output from the compression device 2e'.

Here, in the comparative example of the present embodiment, entropy decoding is performed on the codewords S0', S2', S4', and S6' in the first channel of the decompression device 2f, and entropy decoding is performed on the codewords S1', S3', S5', and S7' in the second channel of the decompression device 2f, but in order to implement such an operation, the packets including the codewords S0', S2', S4', and S6' (that is, the packets generated in the first channel of the compression device 2e') need to be output from the demultiplexer 21' to the first channel (the first packet buffer 23'), and the packets including the codewords S1', S3', S5', and S7' (that is, the packets generated in the second channel of the compression device 2e') need to be output from the demultiplexer 21' to the second channel (the second packet buffer 26').

However, the demultiplexer 21' does not know whether each of the packets included in the compressed stream is a packet generated in the first channel or a packet generated in the second channel in the compression device 2e', and is configured to output the packets cut out from the compressed stream to the first and second channels in response to the packet requests output from the first packet request generating unit 22' and the second packet request generating unit 25'.

Consequently, as described above, in order to process the packet generated by the first channel in the compression device 2e' in the first channel of the decompression device 2f and the packet generated by the second channel in the compression device 2e' in the second channel of the decompression device 2f, it is preferable for the compression device 2e' (the multiplexer 18') to generate a compressed stream in which the order of the packets processed in the first and second channels of the decompression device 2f are took into account (that is, a compressed stream in which packets are arranged in the order in which the first and second channels of the decompression device 2f process the packets). This makes it possible to implement efficient entropy decoding in the decompression device 2f.

In this case, according to the comparative example of the present embodiment, the first packet request generating unit 14' and the second packet request generating unit 17' included in the compression device 2e' generate packet requests so as to reproduce the operation of the first packet request generating unit 22' and the second packet request generating unit 25' (that is, the packet requests generated by the first packet request generating unit 22' and the second packet request generating unit 25') by simulating the state of the first packet buffer 23' and the second packet buffer 26' included in the decompression device 2f.

Here, FIG. 7 is a diagram for explaining the outline of an operation of the first packet request generating unit 14', the second packet request generating unit 17', and the multiplexer 18' included in the compression device 2e' according to the comparative example of the present embodiment.

In a case where the operation of the first packet request generating unit 22' and the second packet request generating unit 25' included in the decompression device 2f is reproduced, as illustrated in FIG. 7, the first packet request generating unit 14' operates to generate a packet request in the cycles C0, C1, C3, and C4. On the other hand, the second packet request generating unit 17' operates to generate a packet request in the cycles C0 to C4.

When packet requests are generated in the same cycle, assuming that the packet is preferentially output to the first channel (the first packet buffer 23'), in the case of the packet requests generated by the first packet request generating unit 22' and the second packet request generating unit 25', the demultiplexer 21' outputs packets cut out from the compressed stream in the order of the first channel, the second channel, the first channel, the second channel, the second channel, the first channel, the second channel . . . .

As a result, the multiplexer 18' included in the compression device 2e' outputs a compressed stream in which the packets A1', B1', A2', B2', B3', A3', and B4' are arranged in order as illustrated in FIG. 7 by outputting the packet requests obtained by reproducing the packet requests generated by the first packet request generating unit 22' and the second packet request generating unit 25' included in the decompression device 2f from the first packet request generating unit 14' and the second packet request generating unit 17' included in the compression device 2e'.

Note that the packets A1' to A3' are packets including the codewords S0', S2', S4', and S6' converted from the first sub-stream in the first channel of the compression device 2e' (that is, packets generated by the first packet generating unit 13'), whereas the packets B1' to B4' are packets including the codewords S1', S3', S5', and S7' converted from the second sub-stream in the second channel of the compression device 2e' (that is, packets generated by the second packet generating unit 16').

In a case where such a compressed stream is input to the decompression device 2f, as described above, in response to the packet requests generated by the first packet request generating unit 22' and the second packet request generating unit 25', the packets A1' to A3' are output from the demultiplexer 21' to the first channel, and the packets B1' to B4' are output from the demultiplexer 21' to the second channel. As a result, in the first channel (the first decoding unit 24') of the decompression device 2f, the codewords S0', S2', S4', and S6' included in the packets A1' to A3' are converted to the symbols S0, S2, S4, and S6.

Similarly, in the second channel (the second decoding unit 27') of the decompression device 2f, the codewords S1', S3', S5', and S7' included in the packets B1' to B4' are converted to the symbols S1, S3, S5, and S7.

Note that the symbols obtained by performing entropy decoding in the first and second channels of the decompression device 2f as described above are integrated in the deinterleaving unit 28'. As a result, the deinterleaving unit 28' outputs the symbol string S0 to S7.

Meanwhile, in a case where the size of each packet included in the compressed stream is a fixed length of 16 bits, 6 bits out of the 16 bits of the packet A3' generated in the first channel of the compression device 2e' correspond to codewords, and all the 16 bits cannot be filled with codewords. In this case, padding data (unnecessary data) is inserted into the remaining 10 bits of the packet A3'. Similarly, 5 bits out of the 16 bits of the packet B4' generated in the second channel of the compression device 2e' correspond to codewords, and all the 16 bits cannot be filled with codewords. In this case, padding data is inserted into the remaining 11 bits of the packet B4'.

In this case, the padding data occupies 21 bits of the amount of data (16 bits×7=112 bits) of the compressed stream in which seven packets A1' to A3' and B1' to B4' are arranged.

In a case where entropy coding using the interleaved storage scheme is performed as described above, padding data may be added to the packets included in the compressed stream, and the padding data causes a decrease in compression efficiency.

Consequently, the present embodiment has a configuration of reducing the padding data (the amount of padding data) described above and improving the compression efficiency.

Hereinafter, an example of an operation of the compression device 2e and the decompression device 2f according to the present embodiment will be described. Here, the difference from the operation of the compression device 2e' and the decompression device 2f' according to the comparative example of the present embodiment described above will be mainly described.

First, as in the comparative example of the present embodiment, it is assumed that the symbol string S0 to S7 is input to the interleaving unit 11, and the symbol string S0 to S7 is distributed to the first sub-stream (the symbols S0, S2, S4, and S6) and to the second sub-stream (the symbols S1, S3, S5, and S7). Furthermore, it is assumed that as illustrated in FIG. 3, the first sub-stream is converted to the codewords S0', S2', S4', and S6' by the first coding unit 12, and the second sub-stream is converted to the codewords S1', S3', S5', and S7' by the second coding unit 15, as illustrated in FIG. 4.

Here, the present embodiment is different from the comparative example of the present embodiment in that the compressed stream including packets with a fixed length of 16 bits is output from the compression device 2e' in the comparative example of the present embodiment, but the compressed stream including packets with a variable length is output from the compression device 2e in the present embodiment.

FIG. 8 is a diagram illustrating the outline of variable length packets included in a compressed stream output from the compression device 2e in the present embodiment. The sizes of the variable length packets included in the compressed stream in the present embodiment are dynamically determined (selected) from, for example, 8 bits and 16 bits. The sizes of the variable length packets, the 8 bits and 16 bits, can be predetermined from, for example, the maximum code length in entropy coding, but the sizes of the variable length packets can be other than the 8 bits and 16 bits, or can be determined from three or more sizes.

In this case, as in the comparative example of the present embodiment, the first packet request generating unit 14 and the second packet request generating unit 17 operate to reproduce the operation of the first packet request generating unit 22 and the second packet request generating unit 25 by simulating the state of the first packet buffer 23 and the second packet buffer 26 included in the decompression device 2f, and the packet requests includes the sizes of the variable length packets (for example, 8 bits or 16 bits).

Although details will be described later, in the case of the configuration in which the compressed stream including 8-bit or 16-bit variable length packets is output from the compression device 2e as described above, by appropriately determining the size of the variable length packets, the 8-bit portion of the padding data illustrated in FIG. 8 corresponding to each of the first and second channels (that is, the padding data inserted in the packets A3' and B4' illustrated in FIG. 7), the portion being filled with the padding data, can be removed.

Hereinafter, the outline of an operation of the first packet request generating unit 22 (the first channel in the decompression device 2f) whose operation is reproduced by the first packet request generating unit 14 in the present embodiment will be described.

As in the comparative example of the present embodiment, the first channel in the decompression device 2f generates a packet request (requests a packet from the demultiplexer 21) so that the packet stored in the first packet buffer 23 is not depleted and performs entropy decoding on the packet. Specifically, the first channel in the decompression device 2f is assumed to generate a packet request in a case where the remaining amount of packets stored in the first packet buffer 23 is less than the maximum code length (16 bits) in entropy coding, and perform entropy decoding on the codewords included in the packets in a case where the remaining amount of packets is more than or equal to the maximum code length. However, it is assumed in the present embodiment that in a case where the remaining amount of packets is less than 8 bits, a 16-bit packet is requested, and in a case where the remaining amount of packets is more than or equal to 8 bits and less than 16 bits, an 8-bit packet is requested. That is, in the present embodiment, the size of the variable length packet is determined based on the remaining amount of packets stored in the first packet buffer 23 in a manner that the remaining amount of packets is more than or equal to the maximum code length in entropy coding.

FIG. 9 illustrates a specific example of an operation of the first channel in the decompression device 2f. Here, it is assumed that the compressed stream includes 8-bit and 16-bit variable length packets, and the first packet buffer 23 is empty (that is, the remaining amount of packets is zero) when the process of the first channel starts.

First, the remaining amount of packets stored in the first packet buffer 23 is zero, which is less than 8 bits. For this reason, the first packet request generating unit 22 generates a packet request including 16 bits as the size of the variable length packet in the cycle C0 and outputs the packet request to the demultiplexer 21.

In this case, in the cycle C1 following the cycle C0, the 16-bit packet output from the demultiplexer 21 in response to the packet request output from the first packet request generating unit 22 in the cycle C0 is stored in the first packet buffer 23.

As a result, the remaining amount of packets stored in the first packet buffer 23 is 16 bits, which is more than or equal to the maximum code length, that is, 16 bits. Consequently, the first decoding unit 24 performs entropy decoding on the codeword included in the packet stored in the first packet buffer 23 to convert the codeword to a symbol. In a case where the symbols S0, S2, S4, and S6 are converted to the codewords S0', S2', S4', and S6' in the first channel of the compression device 2e as described above, the first decoding unit 24 converts the codeword S0' included in the packet stored in the first packet buffer 23 to the symbol S0. Since the codeword S0' is 5 bits, 5 bits are processed out of the packets (16 bits) stored in the first packet buffer 23, and the remaining amount of packets stored in the first packet buffer 23 is 11 bits.

In this case, the remaining amount of packets stored in the first packet buffer 23 is more than or equal to 8 bits and less than 16 bits. For this reason, the first packet request generating unit 22 generates a packet request including 8 bits as the size of the variable length packet and outputs the packet request to the demultiplexer 21.

In the cycle C2 following the cycle C1, the 8-bit packet output from the demultiplexer 21 in response to the packet request output from the first packet request generating unit 22 in the cycle C1 is stored in the first packet buffer 23.

As a result, the remaining amount of packets stored in the first packet buffer 23 is 19 bits (11 bits, which is the remaining amount of packets in the cycle C1+8 bits newly stored in the first packet buffer 23), which is more than or equal to the maximum code length, that is, 16 bits. Consequently, the first decoding unit 24 performs entropy decoding on the codeword included in the packet stored in the first packet buffer 23 to convert the codeword to a symbol. In this case, the codeword S2' following the codeword S0' converted to the symbol S0 in the cycle C1 described above is converted to the symbol S2. Since the codeword S2' is 6 bits, 6 bits are processed out of the remaining amount of packets (19 bits) stored in the first packet buffer 23, and the remaining amount of packets stored in the first packet buffer 23 is 13 bits.

In this case, the remaining amount of packets stored in the first packet buffer 23 is more than or equal to 8 bits and less than 16 bits. For this reason, the first packet request generating unit 22 generates a packet request including 8 bits as the size of the variable length packet and outputs the packet request to the demultiplexer 21.

In the cycle C3 following the cycle C2, the 8-bit packet output from the demultiplexer 21 in response to the packet request output from the first packet request generating unit 22 in the cycle C2 is stored in the first packet buffer 23.

As a result, the remaining amount of packets stored in the first packet buffer 23 is 21 bits (13 bits, which is the remaining amount of packets in the cycle C2+8 bits newly stored in the first packet buffer 23), which is more than or equal to the maximum code length, that is, 16 bits. Consequently, the first decoding unit 24 performs entropy decoding on the codeword included in the packet stored in the first packet buffer 23 to convert the codeword to a symbol. In this case, the codeword S4' following the codeword S2' converted to the symbol S2 in the cycle C2 described above is converted to the symbol S4. Since the codeword S4' is 13 bits, 13 bits are processed out of the remaining amount of packets (21 bits) stored in the first packet buffer 23, and the remaining amount of packets stored in the first packet buffer 23 is 8 bits.

In this case, the remaining amount of packets stored in the first packet buffer 23 is more than or equal to 8 bits and less than 16 bits. For this reason, the first packet request generating unit 22 generates a packet request including 8 bits as the size of the variable length packet and outputs the packet request to the demultiplexer 21.

In the cycle C4 following the cycle C3, the 8-bit packet output from the demultiplexer 21 in response to the packet request output from the first packet request generating unit 22 in the cycle C3 is stored in the first packet buffer 23.

As a result, the remaining amount of packets stored in the first packet buffer 23 is 16 bits (8 bits, which is the remaining amount of packets in the cycle C3+8 bits newly stored in the first packet buffer 23), which is more than or equal to the maximum code length, that is, 16 bits. Consequently, the first decoding unit 24 performs entropy decoding on the codeword included in the packet stored in the first packet buffer 23 to convert the codeword to a symbol. In this case, the codeword S6' following the codeword S4' converted to the symbol S4 in the cycle C3 described above is converted to the symbol S6. Since the codeword S6' is 14 bits, 14 bits are processed out of the remaining amount of packets (16 bits) stored in the first packet buffer 23, and the remaining amount of packets stored in the first packet buffer 23 is 2 bits.

In this case, the remaining amount of packets stored in the first packet buffer 23 is less than 8 bits. For this reason, the first packet request generating unit 22 generates a packet request including 16 bits as the size of the variable length packet and outputs the packet request to the demultiplexer 21.

It is assumed in the decompression device 2f according to the present embodiment that the first packet request generating unit 22 generates a packet request as described above, and thus entropy decoding is sequentially performed on the packets (a plurality of codewords included in the packets) included in the compressed stream output from the compression device 2e.

Here, although the operation of the first packet request generating unit 22 included in the decompression device 2f (the first channel in the decompression device 2f) has been described, a similar operation is performed by the second packet request generating unit 25 included in the decompression device 2f (that is, the second channel in the decompression device 2f).

The second channel in the decompression device 2f generates a packet request (requests a packet from the demultiplexer 21) so that the packet stored in the second packet buffer 26 is not depleted and performs entropy decoding on the packet. Specifically, in a case where the remaining amount of packets stored in the second packet buffer 26 is less than 8 bits, a 16-bit packet is requested, and in a case where the remaining amount of packets is more than or equal to 8 bits and less than 16 bits, an 8-bit packet is requested. Furthermore, entropy decoding is performed on the codeword included in the packet in a case where the remaining amount of packets stored in the second packet buffer 26 is more than or equal to 16 bits.

FIG. 10 illustrates a specific example of an operation of the second channel in the decompression device 2f. It is assumed that the compressed stream includes 8-bit and 16-bit variable length packets, and the second packet buffer 26 is empty (that is, the remaining amount of packets is zero) when the process of the second channel starts, as described above.

First, as described above, the remaining amount of packets stored in the second packet buffer 26 is zero, which is less than 8 bits. For this reason, the second packet request generating unit 25 generates a packet request including 16 bits as the size of the variable length packet in the cycle C0 and outputs the packet request to the demultiplexer 21.

In this case, in the cycle C1 following the cycle C0, the 16-bit packet output from the demultiplexer 21 in response to the packet request output from the second packet request generating unit 25 in the cycle C0 is stored in the second packet buffer 26.

As a result, the remaining amount of packets stored in the second packet buffer 26 is 16 bits, which is more than or equal to the maximum code length, that is, 16 bits. Consequently, the second decoding unit 27 performs entropy decoding on the codeword included in the packet stored in the second packet buffer 26 to convert the codeword to a symbol. In a case where the symbols S1, S3, S5, and S7 are converted to the codewords S1', S3', S5', and S7' in the second channel of the compression device 2e as described above, the second decoding unit 27 converts the codeword S1' included in the packet stored in the second packet buffer 26 to the symbol S1. Since the codeword S1' is 15 bits, 15 bits are processed out of the packets (16 bits) stored in the second packet buffer 26, and the remaining amount of packets stored in the second packet buffer 26 is 1 bit.

In this case, the remaining amount of packets stored in the second packet buffer 26 is less than 8 bits. For this reason, the second packet request generating unit 25 generates a packet request including 16 bits as the size of the variable length packet and outputs the packet request to the demultiplexer 21.

In the cycle C2 following the cycle C1, the 16-bit packet output from the demultiplexer 21 in response to the packet request output from the second packet request generating unit 25 in the cycle C1 is stored in the second packet buffer 26.

As a result, the remaining amount of packets stored in the second packet buffer 26 is 17 bits (1 bit, which is the remaining amount of packets in the cycle C1+16 bits newly stored in the second packet buffer 26), which is more than or equal to the maximum code length, that is, 16 bits. Consequently, the second decoding unit 27 performs entropy decoding on the codeword included in the packet stored in the second packet buffer 26 to convert the codeword to a symbol. In this case, the codeword S3' following the codeword S1' converted to the symbol S1 in the cycle C1 described above is converted to the symbol S3. Since the codeword S3' is 10 bits, 10 bits are processed out of the remaining amount of packets (17 bits) stored in the second packet buffer 26, and the remaining amount of packets stored in the second packet buffer 26 is 7 bits.

In this case, the remaining amount of packets stored in the second packet buffer 26 is less than 8 bits. For this reason, the second packet request generating unit 25 generates a packet request including 16 bits as the size of the variable length packet and outputs the packet request to the demultiplexer 21.

In the cycle C3 following the cycle C2, the 16-bit packet output from the demultiplexer 21 in response to the packet request output from the second packet request generating unit 25 in the cycle C2 is stored in the second packet buffer 26.

As a result, the remaining amount of packets stored in the second packet buffer 26 is 23 bits (7 bits, which is the remaining amount of packets in the cycle C2+16 bits newly stored in the second packet buffer 26), which is more than or equal to the maximum code length, that is, 16 bits. Consequently, the second decoding unit 27 performs entropy decoding on the codeword included in the packet stored in the second packet buffer 26 to convert the codeword to a symbol. In this case, the codeword S5' following the codeword S3' converted to the symbol S3 in the cycle C2 described above is converted to the symbol S5. Since the codeword S5' is 14 bits, 14 bits are processed out of the remaining amount of packets (23 bits) stored in the second packet buffer 26, and the remaining amount of packets stored in the second packet buffer 26 is 9 bits.

In this case, the remaining amount of packets stored in the second packet buffer 26 is more than or equal to 8 bits and less than 16 bits. For this reason, the second packet request generating unit 25 generates a packet request including 8 bits as the size of the variable length packet and outputs the packet request to the demultiplexer 21.

In the cycle C4 following the cycle C3, the 8-bit packet output from the demultiplexer 21 in response to the packet request output from the second packet request generating unit 25 in the cycle C3 is stored in the second packet buffer 26.

As a result, the remaining amount of packets stored in the second packet buffer 26 is 17 bits (9 bits, which is the remaining amount of packets in the cycle C3+8 bits newly stored in the second packet buffer 26), which is more than or equal to the maximum code length, that is, 16 bits. Consequently, the second decoding unit 27 performs entropy decoding on the codeword included in the packet stored in the second packet buffer 26 to convert the codeword to a symbol. In this case, the codeword S7' following the codeword S5' converted to the symbol S5 in the cycle C3 described above is converted to the symbol S7. Since the codeword S7' is 14 bits, 14 bits are processed out of the remaining amount of packets (17 bits) stored in the second packet buffer 26, and the remaining amount of packets stored in the second packet buffer 26 is 3 bits.

In this case, the remaining amount of packets stored in the second packet buffer 26 is less than 8 bits. For this reason, the second packet request generating unit 25 generates a packet request including 16 bits as the size of the variable length packet and outputs the packet request to the demultiplexer 21.

It is assumed in the decompression device 2f according to the present embodiment that the second packet request generating unit 25 generates a packet request as described above, and thus entropy decoding is sequentially performed on the packets (a plurality of codewords included in the packets) included in the compressed stream output from the compression device 2e.

In the present embodiment, the first packet request generating unit 14 and the second packet request generating unit 17 included in the compression device 2e reproduce the operation of the first packet request generating unit 22 and the second packet request generating unit 25 (that is, the packet requests generated by the first packet request generating unit 22 and the second packet request generating unit 25) included in the decompression device 2f by simulating the state of the first packet buffer 23 and the second packet buffer 26 included in the decompression device 2f using the code length of each of the codewords output from the first coding unit 12 and the second coding unit 15.

Figure 11:
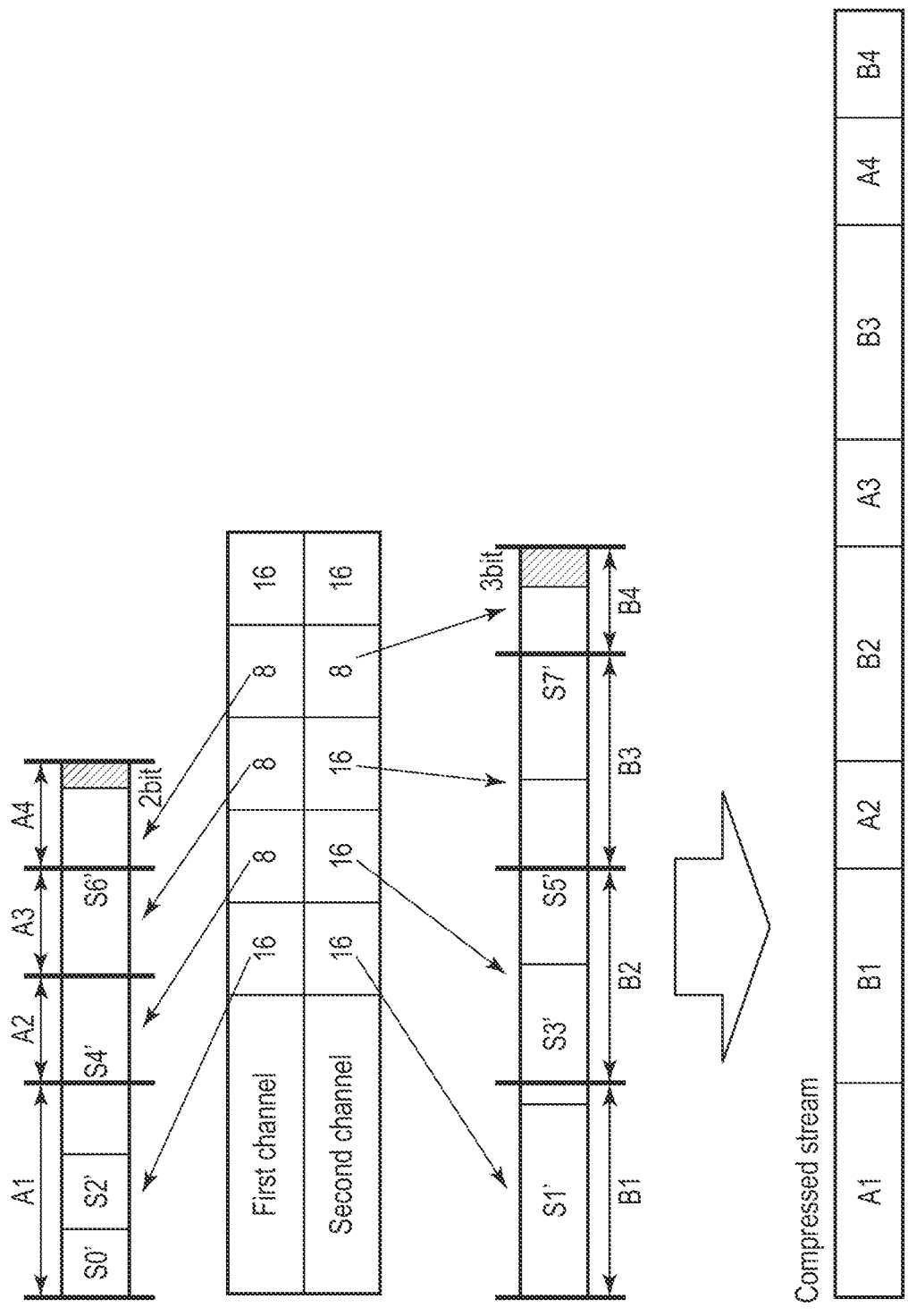
FIG. 11 is a diagram for explaining the outline of an operation of a first packet request generating unit, a second packet request generating unit, and a multiplexer included in the compression device according to the first embodiment.

Here, FIG. 11 is a diagram for explaining the outline of an operation of the first packet request generating unit 14, the second packet request generating unit 17, and the multiplexer 18 included in the compression device 2e according to the present embodiment.

In a case where the operation of the first packet request generating unit 22 and the second packet request generating unit 25 included in the decompression device 2f described above is reproduced, as illustrated in FIG. 11, the first packet request generating unit 14 operates to generate a packet request including 16 bits as the size of the variable length packet in the cycle C0, generate a packet request including 8 bits as the size of the variable length packet in the cycles C1 to C3, and generate a packet request including 16 bits as the size of the variable length packet in the cycle C4. On the other hand, the second packet request generating unit 17 operates to generate a packet request including 16 bits as the size of the variable length packet in the cycles C0 to C2, generate a packet request including 8 bits as the size of the variable length packet in the cycle C3, and generate a packet request including 16 bits as the size of the variable length packet in the cycle C4.

When packet requests are generated in the same cycle, assuming that the packet is preferentially output to the first channel (the first packet buffer 23), in the case of the packet requests generated by the first packet request generating unit 22 and the second packet request generating unit 25, the demultiplexer 21 outputs packets cut out from the compressed stream in the order of the first channel, the second channel, the first channel, the second channel, the first channel, the second channel, the first channel, the second channel . . . .

As a result, the multiplexer 18 included in the compression device 2e outputs a compressed stream in which the packets A1 (16 bits), B1 (16 bits), A2 (8 bits), B2 (16 bits), A3 (8 bits), B3 (16 bits), A4 (8 bits), and B4 (8 bits) are arranged in order as illustrated in FIG. 11 by outputting the packet requests obtained by reproducing the packet requests generated by the first packet request generating unit 22 and the second packet request generating unit 25 included in the decompression device 2f from the first packet request generating unit 14 and the second packet request generating unit 17 included in the compression device 2e.

Note that the packets A1' to A4' are packets including the codewords S0', S2', S4', and S6' converted from the first sub-stream in the first channel of the compression device 2e (that is, packets generated by the first packet generating unit 13), whereas the packets B1 to B4 are packets including the codewords S1', S3', S5', and S7' converted from the second sub-stream in the second channel of the compression device 2e (that is, packets generated by the second packet generating unit 16).

Furthermore, in the present embodiment, the first packet generating unit 13 and the second packet generating unit 16 generate packets for cutting out an 8-bit or 16-bit variable length packet, and the multiplexer 18 can cut out the variable length packet from the packets generated by the first packet generating unit 13 and the second packet generating unit 16 based on the size of the variable length packet included in the packet request. The compressed stream is generated from the variable length packet cut out by the multiplexer 18.

In a case where such a compressed stream is input to the decompression device 2f, as described above, in response to the packet requests generated by the first packet request generating unit 22 and the second packet request generating unit 25, the packets A1 to A4 are output from the demultiplexer 21 to the first channel, and the packets B1 to B4 are output from the demultiplexer 21 to the second channel. As a result, in the first channel (the first decoding unit 24) of the decompression device 2f, the codewords S0', S2', S4', and S6' included in the packets A1 to A4 are converted to the symbols S0, S2, S4, and S6. Similarly, in the second channel (the second decoding unit 27) of the decompression device 2f, the codewords S1, S3, S5, and S7 included in the packets B1 to B4 are converted to the symbols S1, S3, S5, and S7.

As described above, the symbols obtained by performing entropy decoding on the first and second channels in the decompression device 2f are integrated in the deinterleaving unit 28. As a result, the deinterleaving unit 28 outputs the symbol string S0 to S7.

Here, since the compressed stream including the variable length packet is output from the compression device 2e in the present embodiment, as illustrated in FIG. 11, the padding data included in the packet A4 is 2 bits and the padding data included in the packet B4 is 3 bits.

In this case, the padding data of the compressed stream in the comparative example of the present embodiment is 21 bits as described in FIG. 7, and the data amount of the entire compressed stream is 112 bits. On the other hand, in the present embodiment, the packets A1 to A4 and B1 to B4, which are variable length packets, are arranged, and thus the padding data in the compressed stream is 2 bits+3 bits=5 bits, and the amount of data in the entire compressed stream is 96 bits. That is, in the present embodiment, the amount of data in the compressed stream (padding data in the compressed stream) can be reduced by 16 bits as compared with the comparative example of the present embodiment.

As described above, the compression device 2e according to the present embodiment divides the input symbol string into the first sub-stream (a plurality of first symbols) and the second sub-stream (a plurality of second symbols different from the first symbols), and distributes the first and second sub-streams to the first and second channels. In the first channel, coding is performed on the first sub-stream to convert the first sub-stream to a plurality of codewords (first codewords), a packet (first packet) including the codewords is generated, and a first packet request including the size of the variable length packet is generated. Furthermore, in the second channel, coding is performed on the second sub-stream to convert the second sub-stream to a plurality of codewords (second codewords), a packet (second packet) including the codewords is generated, and a packet request (second packet request) including the size of the variable length packet is generated. In the present embodiment, the variable length packet (first variable length packet) is cut out from the packet generated in the first channel based on the size of the variable length packet included in the packet request generated in the first channel (the first packet request generating unit 14) described above, and the variable length packet (second variable length packet) is cut out from the packet generated in the second channel based on the size of the variable length packet included in the packet request generated in the second channel (the second packet request generating unit 17). The compression device 2e outputs the compressed stream including the variable length packet cut out in this way.

In the present embodiment, with such a configuration, it is possible to introduce control to adaptively determine (select) the size of packets included in the compressed stream and reduce the amount of padding data (overhead due to padding data). As a result, it is possible to reduce the size of the compressed stream (compressed data) and improve the compression efficiency.

Note that the decompression device 2f according to the present embodiment includes the demultiplexer 21 configured to input a compressed stream output from the compression device 2e and cut out a variable length packet from the compressed stream. In the first channel of the decompression device 2f, a packet request (third packet request) including the size of the variable length packet is generated, the variable length packet output from the demultiplexer 21 is acquired based on the packet request, and entropy decoding is performed on a plurality of codewords included in the variable length packet to convert the codewords to a plurality of symbols. In addition, in the second channel of the decompression device 2f, a packet request (fourth packet request) including the size of the variable length packet is generated, the variable length packet output from the demultiplexer 21 is acquired based on the packet request, and entropy decoding is performed on a plurality of codewords included in the variable length packet to convert the codewords to a plurality of symbols. The deinterleaving unit 28 included in the decompression device 2f outputs a symbol string including symbols converted from the codewords in the first and second channels (the first decoding unit 24 and the second decoding unit 27).

In this case, the size of the variable length packet included in the packet request generated in the first channel of the decompression device 2f (the first packet request generating unit 22 included in the decompression device 2f) is determined based on the state of the first packet buffer 23 (the code length of each of the codewords to be subjected to entropy decoding by the first decoding unit 24). Furthermore, the size of the variable length packet included in the packet request generated in the second channel of the decompression device 2f (the second packet request generating unit 25 included in the decompression device 2f) is determined based on the state of the second packet buffer 26 (the code length of each of the codewords to be subjected to entropy decoding by the second decoding unit 27).

According to the present embodiment, with the above configuration, the symbol string obtained by appropriately decompressing the compressed stream output from the compression device 2e can be output from the decompression device 2f.

Note that the first packet request generating unit 14 included in the compression device 2e according to the present embodiment generates a packet request so as to reproduce the operation of the first packet request generating unit 22 included in the decompression device 2f by simulating the state of the first packet buffer 23 storing the variable length packet when the first decoding unit 24 included in the decompression device 2f performs entropy decoding on the codewords. Similarly, the second packet request generating unit 17 included in the compression device 2e generates a packet request so as to reproduce the operation of the second packet request generating unit 25 included in the decompression device 2f by simulating the state of the second packet buffer 26 storing the variable length packet when the second decoding unit 27 included in the decompression device 2f performs entropy decoding on the codewords.

In this case, the first packet request generating unit 14 determines the size of the variable length packet based on the remaining amount of packets stored in the simulated first packet buffer 23 (for example, in a manner that the remaining amount of packets is more than or equal to the maximum code length in entropy coding). The second packet request generating unit 17 determines the size of the variable length packet based on the remaining amount of packets stored in the simulated second packet buffer 26 (for example, in a manner that the remaining amount of packets is more than or equal to the maximum code length in entropy coding).

In the present embodiment, with such a configuration, entropy decoding can be appropriately performed on a plurality of codewords obtained by performing entropy coding in the first channel of the compression device 2e in the first channel of the decompression device 2f. Similarly, entropy decoding can be appropriately performed on a plurality of codewords obtained by performing entropy coding in the second channel of the compression device 2e in the second channel of the decompression device 2f.

Furthermore, in the present embodiment, the decompression device 2f operates so that the remaining amount of packets is more than or equal to the maximum code length in entropy coding as described above, and thus, for example, even in a case where entropy decoding is performed on the codeword with the maximum code length, the codeword can be converted to a symbol in one cycle. As a result, the throughput of the decompression device 2f can be guaranteed.

Note that, for example, the compression device 2e (the first coding unit 12 and the second coding unit 15) performs entropy coding, and the decompression device 2f (the first decoding unit 24 and the second decoding unit 27) performs entropy decoding in the present embodiment, but the first coding unit 12 and the second coding unit 15 are only required to perform variable length coding on a plurality of symbols (convert a plurality of symbols in codewords with a variable code length), and can perform coding based on another coding method. In this case, the first decoding unit 24 and the second decoding unit 27 are only required to decode (perform a decoding process on) the result of coding (codeword) by the first coding unit 12 and the second coding unit 15.

Furthermore, the size of the variable length packet included in the packet requests generated by the first packet request generating unit 22 and the second packet request generating unit 25 is selected (determined) from a plurality of predetermined sizes (for example, 8 bits and 16 bits) in the present embodiment, but the size of the variable length packet can be determined by another method.

Further, in the present embodiment, the number of channels in the compression device 2e and the decompression device 2f is assumed to be two for convenience of description, but the number of channels can be three or more.

Second Embodiment

Next, a second embodiment will be described. Note that in the present embodiment, detailed description of parts similar to those of the first embodiment described above will be omitted, and parts different from those of the first embodiment will be mainly described. Furthermore, since the hardware configuration of a memory system and the configuration of a compression device and a decompression device in the present embodiment are similar to those in the first embodiment described above, these configurations will be described with reference to FIGS. 1 and 2 as appropriate.

Hereinafter, an example of an operation of a compression device 2e and a decompression device 2f according to the present embodiment will be described. First, as in the first embodiment described above, it is assumed that symbol string S0 to S7 is input to an interleaving unit 11, and the symbol string S0 to S7 is distributed to a first sub-stream (the symbols S0, S2, S4, and S6) and to a second sub-stream (the symbols S1, S3, S5, and S7). Furthermore, it is assumed that as illustrated in FIG. 3, the first sub-stream is converted to codewords S0', S2', S4', and S6' by a first coding unit 12, and the second sub-stream is converted to codewords S1', S3', S5', and S7' by a second coding unit 15, as illustrated in FIG. 4.

Here, the present embodiment is similar to the first embodiment described above in that a compressed stream including a variable length packet with a size determined (selected) from 8 bits and 16 bits is output from the compression device 2e, but is different from the first embodiment in that a packet request is generated so that packets stored in a first packet buffer 23 and a second packet buffer 26 do not overflow in the first and second channels in the decompression device 2f.

In this case, a first packet request generating unit 14 included in the compression device 2e according to the present embodiment reproduces the operation of a first packet request generating unit 22 included in the decompression device 2f. The outline of an operation of the first packet request generating unit 22 (the first channel of the decompression device 2f) will be described first.

The first channel of the decompression device 2f according to the present embodiment is assumed to generate a packet request in a case where the remaining amount of packets stored in the first packet buffer 23 is less than or equal to 24 bits, and performs entropy decoding on the codeword included in the packet in a case where the remaining amount of packets is more than or equal to the maximum code length (16 bits). It is assumed in the present embodiment that in a case where the remaining amount of packets is less than or equal to 16 bits, a 16-bit packet is requested, and in a case where the remaining amount of packets is more than 16 bits, an 8-bit packet is requested. That is, in the first channel of the decompression device 2f, the sizes of variable length packets are determined based on the amount of processed packets stored in the first packet buffer 23 (the consumption amount of the packets or free capacity in the first packet buffer 23).

FIG. 12 illustrates a specific example of an operation of the first channel in the decompression device 2f. Here, it is assumed that the compressed stream includes 8-bit and 16-bit variable length packets.

It is assumed in the present embodiment that the process of the first channel starts in a state where packets are stored in the first packet buffer 23. Specifically, for example, assuming that the capacity of the first packet buffer 23 (the amount of data that can be stored in the first packet buffer 23) is 32 bits, two 16-bit packets are sequentially stored in the first packet buffer 23 as an initial load. In this case, the first packet request generating unit 22 generates a packet request including 16 bits as the size of the variable length packet in each of cycles C0 and C1, and outputs the packet requests to a demultiplexer 21.

As a result, in a cycle C2 following the cycle C1, the remaining amount of packets stored in the first packet buffer 23 is 32 bits, which is more than or equal to the maximum code length, that is, 16 bits. Consequently, the first decoding unit 24 converts the codeword S0' included in the packet stored in the first packet buffer 23 to the symbol S0. Since the codeword S0' is 5 bits, 5 bits are processed out of the packets (32 bits) stored in the first packet buffer 23, and the remaining amount of packets stored in the first packet buffer 23 is 27 bits.

In this case, since the remaining amount of packets stored in the first packet buffer 23 is not less than or equal to 24 bits, the first packet request generating unit 22 does not generate a packet request.

In a cycle C3 following the cycle C2, the remaining amount of packets stored in the first packet buffer 23 is 27 bits, which is more than or equal to the maximum code length, that is, 16 bits. Consequently, the first decoding unit 24 performs entropy decoding on the codeword included in the packet stored in the first packet buffer 23 to convert the codeword to a symbol. In this case, the codeword S2' following the codeword S0' converted to the symbol S0 in the cycle C2 described above is converted to the symbol S2. Since the codeword S2' is 6 bits, 6 bits are processed out of the remaining amount of packets (27 bits) stored in the first packet buffer 23, and the remaining amount of packets stored in the first packet buffer 23 is 21 bits.

In this case, the remaining amount of packets stored in the first packet buffer 23 is less than or equal to 24 bits and more than 16 bits. For this reason, the first packet request generating unit 22 generates a packet request including 8 bits as the size of the variable length packet and outputs the packet request to the demultiplexer 21.

In a cycle C4 following the cycle C3, the 8-bit packet output from the demultiplexer 21 in response to the packet request output from the first packet request generating unit 22 in the cycle C3 is stored in the first packet buffer 23.

As a result, the remaining amount of packets stored in the first packet buffer 23 is 29 bits (21 bits, which is the remaining amount of packets in the cycle C3+8 bits newly stored in the first packet buffer 23), which is more than or equal to the maximum code length, that is, 16 bits. Consequently, the first decoding unit 24 performs entropy decoding on the codeword included in the packet stored in the first packet buffer 23 to convert the codeword to a symbol. In this case, the codeword S4' following the codeword S2' converted to the symbol S2 in the cycle C3 described above is converted to the symbol S4. Since the codeword S4' is 13 bits, 13 bits are processed out of the remaining amount of packets (29 bits) stored in the first packet buffer 23, and the remaining amount of packets stored in the first packet buffer 23 is 16 bits.

In this case, the remaining amount of packets stored in the first packet buffer 23 is less than or equal to 16 bits. For this reason, the first packet request generating unit 22 generates a packet request including 16 bits as the size of the variable length packet and outputs the packet request to the demultiplexer 21.

In a cycle C5 following the cycle C4, the 16-bit packet output from the demultiplexer 21 in response to the packet request output from the first packet request generating unit 22 in the cycle C4 is stored in the first packet buffer 23.

As a result, the remaining amount of packets stored in the first packet buffer 23 is 32 bits (16 bits, which is the remaining amount of packets in the cycle C4+16 bits newly stored in the first packet buffer 23), which is more than or equal to the maximum code length, that is, 16 bits. Consequently, the first decoding unit 24 performs entropy decoding on the codeword included in the packet stored in the first packet buffer 23 to convert the codeword to a symbol. In this case, the codeword S6' following the codeword S4' converted to the symbol S4 in the cycle C4 described above is converted to the symbol S6. Since the codeword S6' is 14 bits, 14 bits are processed out of the remaining amount of packets (32 bits) stored in the first packet buffer 23, and the remaining amount of packets stored in the first packet buffer 23 is 18 bits.

In this case, the remaining amount of packets stored in the first packet buffer 23 is less than or equal to 24 bits and more than 16 bits. For this reason, the first packet request generating unit 22 generates a packet request including 8 bits as the size of the variable length packet and outputs the packet request to the demultiplexer 21.

It is assumed in the decompression device 2f according to the present embodiment that the first packet request generating unit 22 generates a packet request as described above, and thus entropy decoding is sequentially performed on the packets (a plurality of codewords included in the packets) included in the compressed stream output from the compression device 2e.

Here, although the operation of the first packet request generating unit 22 included in the decompression device 2f (the first channel in the decompression device 2f) has been described, a similar operation is performed by a second packet request generating unit 25 included in the decompression device 2f (that is, the second channel in the decompression device 2f).

The second channel of the decompression device 2f operates to generate a packet request in a case where the remaining amount of packets stored in the second packet buffer 26 is less than or equal to 24 bits, and perform entropy decoding on the codeword included in the packet in a case where the remaining amount of packets is more than or equal to the maximum code length (16 bits). In a case where the remaining amount of packets is less than or equal to 16 bits, a 16-bit packet is requested, and in a case where the remaining amount of packets is more than 16 bits, an 8-bit packet is requested. That is, in the second channel of the decompression device 2f, the sizes of the variable length packets are determined based on the amount of processed packets stored in the second packet buffer 26 (the consumption amount of the packets or free capacity in the second packet buffer 26).

FIG. 13 illustrates a specific example of an operation of the second channel in the decompression device 2f. Here, it is assumed that the compressed stream includes 8-bit and 16-bit variable length packets.

It is assumed in the present embodiment that the process of the second channel starts in a state where packets are stored in the second packet buffer 26 as in the case of the first channel described above. Specifically, for example, assuming that the capacity of the second packet buffer 26 (the amount of data that can be stored in the second packet buffer 26) is 32 bits, two 16-bit packets are sequentially stored in the second packet buffer 26 as an initial load. In this case, the second packet request generating unit 25 generates a packet request including 16 bits as the size of the variable length packet in each of the cycles C0 and C1, and outputs the packet requests to the demultiplexer 21.

As a result, in the cycle C2 following the cycle C1, the remaining amount of packets stored in the second packet buffer 26 is 32 bits, which is more than or equal to the maximum code length, that is, 16 bits. Consequently, the second decoding unit 27 converts the codeword S1' included in the packet stored in the second packet buffer 26 to the symbol S1. Since the codeword S1' is 15 bits, 15 bits are processed out of the packets (32 bits) stored in the second packet buffer 26, and the remaining amount of packets stored in the second packet buffer 26 is 17 bits.

In this case, the remaining amount of packets stored in the second packet buffer 26 is less than or equal to 24 bits and more than 16 bits. For this reason, the second packet request generating unit 25 generates a packet request including 8 bits as the size of the variable length packet and outputs the packet request to the demultiplexer 21.

In the cycle C3 following the cycle C2, the 8-bit packet output from the demultiplexer 21 in response to the packet request output from the second packet request generating unit 25 in the cycle C2 is stored in the second packet buffer 26.

As a result, the remaining amount of packets stored in the second packet buffer 26 is 25 bits (17 bits, which is the remaining amount of packets in the cycle C2+8 bits newly stored in the second packet buffer 26), which is more than or equal to the maximum code length, that is, 16 bits. Consequently, the second decoding unit 27 performs entropy decoding on the codeword included in the packet stored in the second packet buffer 26 to convert the codeword to a symbol. In this case, the codeword S3' following the codeword S1' converted to the symbol S1 in the cycle C2 described above is converted to the symbol S3. Since the codeword S3' is 10 bits, 10 bits are processed out of the remaining amount of packets (25 bits) stored in the second packet buffer 26, and the remaining amount of packets stored in the second packet buffer 26 is 15 bits.

In this case, the remaining amount of packets stored in the second packet buffer 26 is less than or equal to 16 bits. For this reason, the second packet request generating unit 25 generates a packet request including 16 bits as the size of the variable length packet and outputs the packet request to the demultiplexer 21.

In the cycle C4 following the cycle C3, the 16-bit packet output from the demultiplexer 21 in response to the packet request output from the second packet request generating unit 25 in the cycle C3 is stored in the second packet buffer 26.

As a result, the remaining amount of packets stored in the second packet buffer 26 is 31 bits (15 bits, which is the remaining amount of packets in the cycle C3+16 bits newly stored in the second packet buffer 26), which is more than or equal to the maximum code length, that is, 16 bits. Consequently, the second decoding unit 27 performs entropy decoding on the codeword included in the packet stored in the second packet buffer 26 to convert the codeword to a symbol. In this case, the codeword S5' following the codeword S3' converted to the symbol S3 in the cycle C3 described above is converted to the symbol S5. Since the codeword S5' is 14 bits, 14 bits are processed out of the remaining amount of packets (31 bits) stored in the second packet buffer 26, and the remaining amount of packets stored in the second packet buffer 26 is 17 bits.

In this case, the remaining amount of packets stored in the second packet buffer 26 is less than or equal to 24 bits and more than 16 bits. For this reason, the second packet request generating unit 25 generates a packet request including 8 bits as the size of the variable length packet and outputs the packet request to the demultiplexer 21.

In the cycle C5 following the cycle C4, the 8-bit packet output from the demultiplexer 21 in response to the packet request output from the second packet request generating unit 25 in the cycle C4 is stored in the second packet buffer 26.

As a result, the remaining amount of packets stored in the second packet buffer 26 is 25 bits (17 bits, which is the remaining amount of packets in the cycle C4+8 bits newly stored in the second packet buffer 26), which is more than or equal to the maximum code length, that is, 16 bits. Consequently, the second decoding unit 27 performs entropy decoding on the codeword included in the packet stored in the second packet buffer 26 to convert the codeword to a symbol. In this case, the codeword S7' following the codeword S5' converted to the symbol S5 in the cycle C4 described above is converted to the symbol S7. Since the codeword S7' is 14 bits, 14 bits are processed out of the remaining amount of packets (25 bits) stored in the second packet buffer 26, and the remaining amount of packets stored in the second packet buffer 26 is 11 bits.

In this case, the remaining amount of packets stored in the second packet buffer 26 is less than or equal to 16 bits. For this reason, the second packet request generating unit 25 generates a packet request including 16 bits as the size of the variable length packet and outputs the packet request to the demultiplexer 21.

It is assumed in the decompression device 2f according to the present embodiment that the second packet request generating unit 25 generates a packet request as described above, and thus entropy decoding is sequentially performed on the packets (a plurality of codewords included in the packets) included in the compressed stream output from the compression device 2e.

In the present embodiment, the first packet request generating unit 14 and the second packet request generating unit 17 included in the compression device 2e reproduce the operation of the first packet request generating unit 22 and the second packet request generating unit 25 (that is, the packet requests generated by the first packet request generating unit 22 and the second packet request generating unit 25) included in the decompression device 2f by simulating the state of the first packet buffer 23 and the second packet buffer 26 included in the decompression device 2f using the code length of each of the codewords output from the first coding unit 12 and the second coding unit 15.

Here, FIG. 14 is a diagram for explaining the outline of an operation of the first packet request generating unit 14, the second packet request generating unit 17, and a multiplexer 18 included in the compression device 2e according to the present embodiment.

In a case where the operation of the first packet request generating unit 22 and the second packet request generating unit 25 included in the decompression device 2f described above is reproduced, as illustrated in FIG. 14, the first packet request generating unit 14 operates to generate a packet request including 16 bits as the size of the variable length packet in the cycles C0 and C1, generate a packet request including 8 bits as the size of the variable length packet in the cycle C3, generate a packet request including 16 bits as the size of the variable length packet in the cycle C4, and generate a packet request including 8 bits as the size of the variable length packet in the cycle C5. On the other hand, the second packet request generating unit 17 operates to generate a packet request including 16 bits as the size of the variable length packet in the cycles C0 and C1, generate a packet request including 8 bits as the size of the variable length packet in the cycle C2, generate a packet request including 16 bits as the size of the variable length packet in the cycle C3, generate a packet request including 8 bits as the size of the variable length packet in the cycle C4, and generate a packet request including 16 bits as the size of the variable length packet in the cycle C5.

When packet requests are generated in the same cycle, assuming that the packet is preferentially output to the first channel (the first packet buffer 23), in the case of the packet requests generated by the first packet request generating unit 22 and the second packet request generating unit 25, the demultiplexer 21 outputs packets cut out from the compressed stream in the order of the first channel, the second channel, the first channel, the second channel, the second channel, the first channel, the second channel . . . .

As a result, the multiplexer 18 included in the compression device 2e outputs a compressed stream in which the packets A1 (16 bits), B1 (16 bits), A2 (16 bits), B2 (16 bits), B3 (8 bits), A3 (8 bits), and B4 (16 bits) are arranged in order as illustrated in FIG. 14 by outputting the packet requests obtained by reproducing the packet requests generated by the first packet request generating unit 22 and the second packet request generating unit 25 included in the decompression device 2f from the first packet request generating unit 14 and the second packet request generating unit 17 included in the compression device 2e.

Note that the packets A1' to A3' are packets including the codewords S0', S2', S4', and S6' converted from the first sub-stream in the first channel of the compression device 2e (that is, packets generated by the first packet generating unit 13), whereas the packets B1 to B4 are packets including the codewords S1', S3', S5', and S7' converted from the second sub-stream in the second channel of the compression device 2e (that is, packets generated by the second packet generating unit 16).

In the present embodiment, since a packet request is generated so that packets stored in the first packet buffer 23 and the second packet buffer 26 do not overflow, two 16-bit packets are first requested as an initial load. Consequently, a predetermined number of packets with a predetermined size are arranged (located) at the head of the compressed stream in the present embodiment. Note that the number and size of packets (variable length packets) arranged at the head of the compressed stream can be determined depending on the size of each of the first packet buffer 23 and the second packet buffer 26, for example.

In a case where such a compressed stream is input to the decompression device 2f, as described above, in response to the packet requests generated by the first packet request generating unit 22 and the second packet request generating unit 25, the packets A1 to A3 are output from the demultiplexer 21 to the first channel, and the packets B1 to B4 are output from the demultiplexer 21 to the second channel. As a result, in the first channel (the first decoding unit 24) of the decompression device 2f, the codewords S0', S2', S4', and S6' included in the packets A1 to A3 are converted to the symbols S0, S2, S4, and S6. Similarly, in the second channel (the second decoding unit 27) of the decompression device 2f, the codewords S1, S3, S5, and S7 included in the packets B1 to B4 are converted to the symbols S1, S3, S5, and S7.

Note that the multiplexer 18 included in the compression device 2e of the present embodiment can generate a compressed stream by cutting out a variable length packet based on the size of the variable length packet included in the packet request, as in the first embodiment described above. In addition, a deinterleaving unit 28 included in the decompression device 2f can output the symbol string S0 to S7 by integrating symbols obtained by performing entropy decoding in the first and second channels of the decompression device 2f as described above, as in the first embodiment described above.

Here, since the compressed stream including the variable length packet is output from the compression device 2e in the present embodiment, as illustrated in FIG. 14, the padding data included in the packet A3 is 2 bits and the padding data included in the packet B4 is 3 bits.

In this case, the amount of data in the compressed stream (padding data in the compressed stream) can be reduced by 16 bits as compared with the comparative example of the first embodiment.

As described above, in the present embodiment, even in a configuration of determining the sizes of the variable length packets included in the packet requests based on the amount of processed packets (the processed amount of data in the variable length packets) stored in the first packet buffer 23 and the second packet buffer 26 (that is, generating packet requests so that packets stored in the first packet buffer 23 and the second packet buffer 26 do not overflow) unlike the first embodiment described above, the amount of padding data can be reduced and the compression efficiency can be improved.

In the present embodiment, entropy decoding starts in a state where packets based on to the size of the first packet buffer 23 and the second packet buffer 26 are stored in the first packet buffer 23 and the second packet buffer 26. Consequently, it is assumed that a packet (a variable length packet) with a size based on the size of the first packet buffer 23 and the second packet buffer 26 is arranged at the head of the compressed stream. With such a configuration, efficient entropy decoding (processing) can be implemented in the decompression device 2f.

Here, it has been described in the present embodiment that the first packet request generating unit 22 and the second packet request generating unit 25 generate packet requests by simulating the state of the first packet buffer 23 and the second packet buffer 26 as in the first embodiment described above. However, the compression device 2e according to the present embodiment can have a configuration of determining, for example, the sizes of the variable length packets included in the packets generated by the first packet request generating unit 22 and the second packet request generating unit 25 based on whether or not a plurality of codewords converted from the first and second sub-streams by the first coding unit 12 and the second coding unit 15 cross packet boundary candidates (hereinafter, referred to as "modification of the present embodiment"). Whether or not the codewords cross the packet boundary candidates can be judged from the code length of the codewords.

Specifically, for example, the size of the variable length packet determined in the nth codeword can be calculated by "number of packet boundary candidates crossed by nth codeword×interval width of packet boundary candidates" (hereinafter, referred to as "expression (1)").

Further, "number of packet boundary candidates crossed by nth codeword" can be calculated by the following expression (2).

The codeword S0' has a code length of 5 bits, and when the code length is applied to the above expression (2), the number of packet boundary candidates crossed by the 0th codeword S0' is zero. As a result, the size of the variable length packet determined in the 0th codeword S0' is calculated as 0 bit from the above expression (1).

The first codeword is the codeword S2'. The codeword S2' has a code length of 6 bits, and when this code length and the code length of the codeword S0' are applied to the above expression (2), the number of packet boundary candidates crossed by the first codeword S2' is one. As a result, the size of the variable length packet determined in the first codeword S2' is calculated as 8 bits from the above expression (1).

The second codeword is the codeword S4'. The codeword S4' has a code length of 13 bits, and when this code length and the code lengths of the codewords S0' and S2' are applied to the above expression (2), the number of packet boundary candidates crossed by the second codeword S4' is two. As a result, the size of the variable length packet determined in the second codeword S4' is calculated as 16 bits from the above expression (1).

The third codeword is the codeword S6'. The codeword S6' has a code length of 14 bits, and when this code length and the code lengths of the codewords S0' and S2', and S4' are applied to the above expression (2), the number of packet boundary candidates crossed by the third codeword S6' is one. As a result, the size of the variable length packet determined in the third codeword S6' is calculated as 8 bits from the above expression (1).

As described above, in a case where the size of the variable length packet is determined based on whether or not the codewords S0', S2', S4', and S6' converted from the first Expression (2)

$$\text{Number of packet boundary candidates crossed by } nth \text{ codeword} = \begin{cases} \left\lfloor \dfrac{\text{code length }(0)}{\text{interval width of packet boundary candidate}} \right\rfloor, & n = 0 \\ \left\lfloor \dfrac{\sum_{i=0}^{n} \text{code length }(i)}{\text{interval width of packet boundary candidate}} \right\rfloor - \left\lfloor \dfrac{\sum_{i=0}^{n-1} \text{code length }(i)}{\text{interval width of packet boundary candidate}} \right\rfloor, & n \geq 1 \end{cases}$$

Hereinafter, the modification of the present embodiment will be specifically described with reference to FIGS. 15 and 16. Here, it is assumed that the sizes of the variable length packets are determined (selected) from 8 bits and 16 bits as described above, and the packet boundary candidates in this case correspond to the boundaries of 8-bit fixed length packets (that is, set in 8-bit units). Further, the head codeword among a plurality of codewords obtained by performing entropy coding in the first and second channels of the compression device 2e is the 0th.

Figure 15:
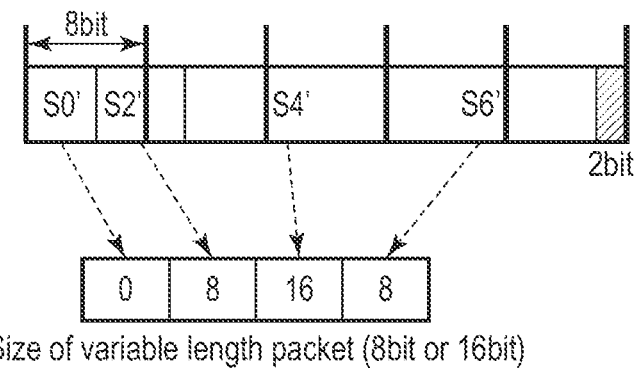
FIG. 15 is a diagram for specifically explaining a modification of the second embodiment.

First, FIG. 15 is a diagram for explaining the size of a variable length packet included in a packet request generated by the first packet request generating unit 22 in the modification of the present embodiment.

Assuming that the first sub-stream is converted to the codewords S0', S2', S4' and S6' as described above with reference to FIG. 3, the 0th codeword is the codeword S0'.

sub-stream cross the packet boundary candidates, as illustrated in FIG. 15, the sizes of the variable length packets are 0 bit, 8 bits, 16 bits, and 8 bits. As a result, when combined with two variable length packets (16 bits) initially requested from the first channel as an initial load as described above, the first packet request generating unit 22 in the modification of the present embodiment can generate a packet request including the size of the variable length packet similar to that included in the packet request illustrated in FIG. 14.

Figure 16:
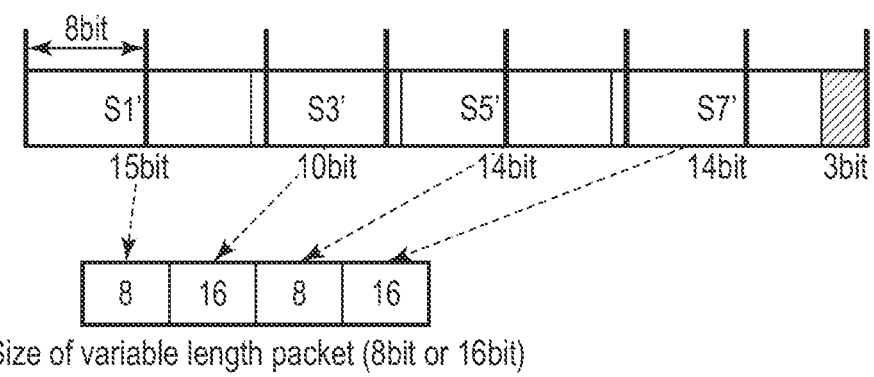
FIG. 16 is a diagram for specifically explaining the modification of the second embodiment.

Next, FIG. 16 is a diagram for explaining the size of a variable length packet included in a packet request generated by the second packet request generating unit 25 in the modification of the present embodiment.

Assuming that the second sub-stream is converted to the codewords S1', S3', S5' and S7' as described above with reference to FIG. 4, the 0th codeword is the codeword S1'.

The codeword S1' has a code length of 15 bits, and when this code length is applied to the above expression (2), the number of packet boundary candidates crossed by the 0th codeword S1' is one. As a result, the size of the variable length packet determined in the 0th codeword S1' is calculated as 8 bits from the above expression (1).

The first codeword is the codeword S3'. The codeword S3' has a code length of 10 bits, and when this code length and the code length of the codeword S1' are applied to the above expression (2), the number of packet boundary candidates crossed by the first codeword S3' is two. As a result, the size of the variable length packet determined in the first codeword S3' is calculated as 16 bits from the above expression (1).

The second codeword is the codeword S5'. The codeword S5' has a code length of 14 bits, and when this code length and the code lengths of the codewords S1' and S3' are applied to the above expression (2), the number of packet boundary candidates crossed by the second codeword S5' is one. As a result, the size of the variable length packet determined in the second codeword S5' is calculated as 8 bits from the above expression (1).

The third codeword is the codeword S7'. The codeword S7' has a code length of 14 bits, and when this code length and the code lengths of the codewords S1', S3', and S5' are applied to the above expression (2), the number of packet boundary candidates crossed by the third codeword S7' is two. As a result, the size of the variable length packet determined in the third codeword S7' is calculated as 16 bits from the above expression (1).

As described above, in a case where the size of the variable length packet is determined based on whether or not the codewords S1', S3', S5', and S7' converted from the second sub-stream cross the packet boundary candidates, as illustrated in FIG. 15, the sizes of the variable length packets are 8 bits, 16 bits, 8 bits, and 16 bits. As a result, when combined with two variable length packets (16 bits) initially requested from the second channel as an initial load as described above, the second packet request generating unit 25 in the modification of the present embodiment can generate a packet request including the size of the variable length packet similar to that included in the packet request illustrated in FIG. 14.

That is, in the modification of the present embodiment, in a case where, for example, 8-bit fixed length packets are generated in order from the head of a plurality of codewords, whether or not each of the codewords crosses the boundaries of the fixed length packets is judged, and the sizes of the variable length packets are determined based on the result of the judgements. As a result, the compression efficiency can be improved as in the present embodiment.

In the modification of the present embodiment, the configuration of determining the sizes of the variable length packets based on the result of the judgements as to whether or not each of the codewords crosses the boundaries of the fixed length packets is applied to the compression device 2e and the decompression device 2f.

Third Embodiment

Next, a third embodiment will be described. Note that in the present embodiment, detailed description of parts similar to those of the first embodiment described above will be omitted, and parts different from those of the first embodiment will be described. Furthermore, since the hardware configuration of a memory system in the present embodiment is similar to that in the first embodiment described above, the configuration will be described with reference to FIG. 1 as appropriate.

It is assumed in the present embodiment that a compression device 2e compresses data by a compression algorithm combining the dictionary coding and the entropy coding described above. In this case, in the compression device 2e, entropy coding is performed on a symbol string including the result of dictionary coding. As illustrated in FIG. 17, the result of dictionary coding includes literal information 101, match length information 102, and distance information 103.

The literal information 101 is information output as the result of dictionary coding in a case where the past data matching dictionary coding target data is not present in a history buffer (a dictionary) (that is, the dictionary coding target data does not match data in the dictionary), and corresponds to information indicating the dictionary coding target data.

The match length information 102 is information output as the result of dictionary coding in a case where the past data matching dictionary coding target data is present in the history buffer (that is, the dictionary coding target data matches the data in the dictionary), and corresponds to information indicating the length at which the dictionary coding target data matches the past data.

The distance information 103 is information output as the result of dictionary coding in a case where the past data matching dictionary coding target data is present in the history buffer, and corresponds to information indicating the position of the past data in the history buffer (the distance to the past data).

Note that the distance information 103 can have a data structure in which second distance information 103b corresponding to an extended bit is added to first distance information 103a. Similarly, the match length information 102 can have a data structure in which second match length information 102b corresponding to the extended bit is added to first match length information 102a.

Furthermore, in a case where the past data matching the dictionary coding target data is present in the history buffer as described above, pieces of the match length information 102 and the distance information 103 are output as a set of information.

In the present embodiment, entropy coding is performed on a symbol string including pieces of the literal information, the match length information, and the distance information (the first and second distance information) as symbols. In the following description, the literal information included in the symbol string is referred to as "symbol L", the match length information included in the symbol string is referred to as "symbol ML", the first distance information included in the symbol string is referred to as "symbol CN", and the second distance information included in the symbol string is referred to as "symbol EX".

Here, for example, it is assumed that entropy coding is performed on a symbol string 201 illustrated in FIG. 18 in first and second channels of the compression device 2e. In the symbol string 201 illustrated in FIG. 18, a plurality of symbols S0 to S7 are arranged in order. The symbol S0 is a symbol ML0, the symbol S1 is a symbol CN0, the symbol S2 is a symbol EX0, the symbol S3 is a symbol L1, the symbol S4 is a symbol L2, the symbol S5 is a symbol ML3, the symbol S6 is a symbol CN3, and the symbol S7 is a symbol EX3.

Assuming that the even-numbered symbols in the symbol string illustrated in FIG. 18 are distributed to the first channel as a first sub-stream and the odd-numbered symbols are distributed to the second channel as a second sub-stream, the first sub-stream includes the symbol ML0, the symbol EX0, the symbol L2, and the symbol CN3, and the second sub-stream includes the symbol CN0, the symbol L1, the symbol ML3, and the symbol EX3.

In a case where entropy coding is performed on the first and second sub-streams in parallel in the first and second channels, for example, entropy coding is performed on the symbol ML0 and the symbol CN0 in the same cycle. In this case, entropy decoding of the codeword converted from the symbol ML0 by entropy coding and entropy decoding of the codeword converted from the symbol CN0 are performed in the same cycle in a decompression device 2f. In the following description, for example, the codeword converted from the symbol ML0 is referred to as "codeword ML0'" and the codeword converted from the symbol CN0 is referred to as "codeword CN0'", and the same holds true for other codewords.

Here, as described above, in a case where the past data matching the dictionary coding target data is present in the history buffer, pieces of the match length information and the distance information (the first and second distance information) are obtained as the result of dictionary coding and output as a set of information, and in the symbol string 201, the symbol CN (the first distance information) and the symbol EX (the second distance information) are arranged after the symbol ML (the match length information). In this case, it can be said that there is a dependency relationship between the symbol ML (the match length information), the symbol CN (the first distance information), and the symbol EX (the second distance information).

In a case where entropy decoding is performed on the codeword ML0' and the codeword CN0' that have such a dependency relationship, it is recognized that the symbol CN is arranged after the symbol ML0 by converting the codeword ML0' to the symbol ML0 using entropy decoding of the codeword ML0', and then entropy decoding is performed on the codeword CN0'. As a result, the codeword CN0' can be appropriately converted to the symbol CN. In other words, the codeword CN0' can converted to the symbol CN0 only after entropy decoding is performed on the codeword ML0'. Note that the same holds true for entropy decoding of the codeword EX0' converted from the symbol EX0.

As a result, in the case of the configuration in which entropy decoding is performed on the codeword ML0' and the codeword CN0' in parallel in the same cycle as described above, the codeword CN0' cannot be converted to the symbol CN0 in the cycle, and thus the throughput of the decompression device 2f cannot be improved.

Consequently, in view of the above circumstances, the present embodiment has a configuration of improving the throughput of the decompression device 2f.

FIG. 19 is a diagram illustrating an example of a configuration of the compression device 2e and the decompression device 2f according to the present embodiment. Note that in FIG. 19, the same reference numerals are given to parts similar to those in FIG. 2 described above, and detailed description thereof will be omitted. Here, the parts different from those in FIG. 2 will be mainly described.

The compression device 2e according to the present embodiment includes a sorting unit 19. The sorting unit 19 inputs a symbol string as described above, and sorts the symbol string (a plurality of symbols included in the symbol string) so that entropy decoding is not performed on a plurality of codewords converted from a plurality of symbols having a dependency relationship (for example, the symbol ML0 and symbol CN0, or the like) in the same cycle in the decompression device 2f (the first and second channels).

Furthermore, the decompression device 2f according to the present embodiment includes a notification unit 29 and a sorting unit 30. The notification unit 29 inputs symbols converted from codewords included in packets by a first decoding unit 24 and a second decoding unit 27 from the first decoding unit 24 and the second decoding unit 27, and outputs the symbols to a deinterleaving unit 28. In addition, in a case where the codeword ML' (the codeword converted from the symbol ML) is converted to the symbol ML in a predetermined cycle in at least one of the first and second channels (that is, the symbol ML is input from the first decoding unit 24 or the second decoding unit 27), the notification unit 29 notifies at least one of the first decoding unit 24 and the second decoding unit 27 that entropy decoding is performed on the codeword CN' (the codeword converted from the symbol CN) in the next cycle.

In this case, the first decoding unit 24 and the second decoding unit 27 perform entropy decoding on the codeword CN according to the notification from the notification unit 29, and converts the codeword CN' to the symbol CN.

Note that in the present embodiment, the symbol string output from the deinterleaving unit 28 is a symbol string in which a plurality of symbols are sorted by the sorting unit 19 included in the compression device 2e described above.

Consequently, the sorting unit 30 outputs the symbol string before the sort of the symbols by the sorting unit 19 by sorting the symbol string (the symbols included in the symbol string) output from the deinterleaving unit 28.

Hereinafter, an example of an operation of a compression device 2e and a decompression device 2f according to the present embodiment will be described. Here, an operation of the sorting unit 19 included in the compression device 2e and the notification unit 29 and the sorting unit 30 included in the decompression device 2f will be mainly described.

First, the operation of the sorting unit 19 included in the compression device 2e will be described with reference to FIG. 20. Here, it is assumed that the symbol string 201 illustrated in FIG. 18 described above is input to the sorting unit 19.

Here, there is a dependency relationship between the symbol ML, the symbol CN, and the symbol EX as described above. The symbol ML is a symbol that affects entropy decoding of the codeword CN' and the codeword EX' converted from the symbol CN and the symbol EX by entropy coding, and thus it can be said that the symbol ML is the source of dependency in the dependency relationship. On the other hand, the symbol CN and the symbol EX can be said to be symbols that are dependent in the dependency relationship.

Figures 20, 21:
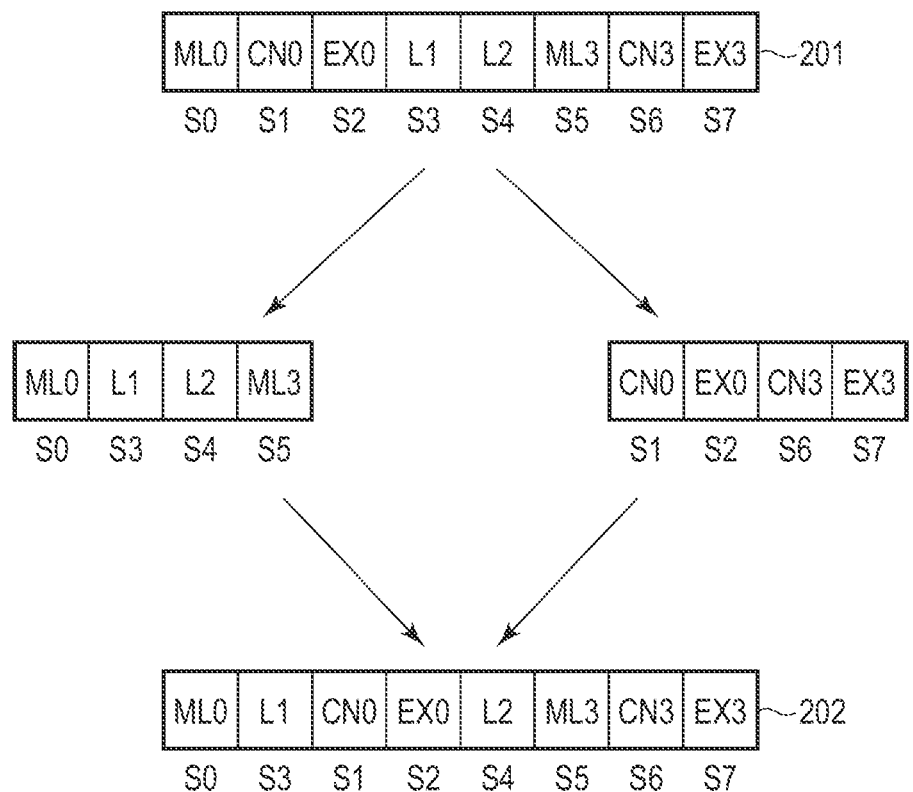
FIG. 20 is a diagram for explaining an operation of a sorting unit included in the compression device according to the third embodiment.
FIG. 21 is a diagram for explaining an operation of a notification unit included in the decompression device according to the third embodiment.

In this case, as illustrated in FIG. 20, the sorting unit 19 classifies the symbols S0 to S7 included in the symbol string 201 into a group of symbols that are the source of dependency (hereinafter referred to as "first group") and into a group of symbols that are dependent (hereinafter referred to as "second group"). Note that the symbol L is a symbol that has no dependency relationship with other symbols (that is, is not a symbol that is the source of dependency or a symbol that is dependent), but the symbol L1 is classified into the first group.

In the example illustrated in FIG. 20, among the symbols S0 to S7, the symbols S0, S3, S4, and S5 are classified into the first group and the symbols S1, S2, S6, and S7 are classified into the second group.

Note that the symbols S0, S3, S4, and S5 classified into the first group and the symbols S1, S2, S6, and S7 classified into the second group are stored in buffers (not illustrated), respectively.

Here, in a case where the compression device 2e and the decompression device 2f operate as described in the first embodiment described above, for example, entropy decoding is performed in parallel in the same cycle on two codewords converted from the symbols arranged in the same order in the first and second sub-streams.

Consequently, the sorting unit 19, for example, sorts the symbols S0 to S7 so that the order of the symbols classified into the first group (the symbols that are the source of dependency) and the order of the symbols classified into the second group (the symbols that dependent) are different in the first and second sub-streams.

In this case, assuming that an interleaving unit 11 distributes the even-numbered symbols to the first channel and the odd-numbered symbols to the second channel as described in the first embodiment described above, in a case where the symbol that is the source of dependency is arranged at the even-numbered position in the symbol string and the symbol that is dependent is arranged at the odd-numbered position following the even-numbered position, the order of the symbol that is the source of dependency in the first sub-stream is the same as the order of the symbol that is dependent in the second sub-stream.

Consequently, in the example illustrated in FIG. 20, two symbols S0 and S3 out of the symbols S0, S3, S4, and S5 classified into the first group are arranged at the head of the symbol string, and two symbols S1 and S2 out of the symbols S1, S2, S6, and S7 classified into the second group are arranged next to the symbols S0 and S3. Similarly, the sorting unit 19 arranges two symbols S4 and S5 out of the symbols S0, S3, S4, and S5 classified into the first group next to the symbols S1 and S2, and two symbols S6 and S7 out of the symbols S1, S2, S6, and S7 classified into the second group next to the symbols S4 and S5.

As a result, as illustrated in FIG. 20, the symbol string 201 including the symbols S0 to S7 in this order is sorted into a symbol string 202 including the symbols S0, S3, S1, S2, S4, S5, S6, and S7 in this order.

For example, in the compression device 2e according to the first embodiment, the interleaving unit 11 divides the symbols S0 to S7 included in the symbol string 201 into the first sub-stream (the symbols S0, S2, S4, and S6) and the second sub-stream (the symbols S1, S3, S5, and S7) and distributes the first sub-stream and the second sub-stream to the first and second channels, and thus, for example, entropy decoding is performed on two codewords converted from the symbol S0 (the symbol ML0 that is the source of dependency) and the symbol S1 (the symbol CN0 that is dependent) in parallel in the same cycle, and the throughput of the decompression device 2f cannot be improved.

On the other hand, in the compression device 2e according to the present embodiment, by sorting the symbol string 201 into the symbol string 202 as described in FIG. 20, the interleaving unit 11 divides the symbol string 202 into the first sub-stream (the symbols S0, S1, S4, and S6) and the second sub-stream (the symbols S3, S2, S5, and S7), and distributes the first sub-stream to the first channel and the second sub-stream to the second channel.

As a result, for example, entropy decoding of the codeword ML0' converted from the symbol ML0, which is the source of dependency, is performed in parallel with entropy decoding of the codeword L1' converted from the symbol L1. Furthermore, entropy decoding of the codeword CN0' converted from the symbol CN0, which is dependent, is performed in parallel with entropy decoding of the codeword EX0' converted from the symbol EX0.

That is, in a case where the symbol string 201 is sorted into the symbol string 202 as described above, it is possible to prevent entropy decoding of the codeword ML0' converted from the symbol ML0 that is the source of dependency from being performed in parallel with entropy decoding of the codeword CN0' converted from the symbol CN0 that is dependent (or the codeword EX0' converted from the symbol EX0) in the same cycle.

Note that the first coding unit 12 and the second coding unit 15 perform entropy coding on a plurality of symbols constituting the first and second sub-streams, and entropy coding is performed using different coding tables based on the type of the symbol. In other words, for example, entropy coding of the symbol ML0 is performed using the coding table corresponding to the symbol ML0 (that is, literal information). The same holds true for the case of performing entropy coding on other symbols. Note that the coding table is information for performing appropriate entropy coding on each symbol (that is, for converting the symbol to a codeword), and is only required to, for example, be held in advance in a first coding unit 12 and a second coding unit 15.

Although the description is omitted in the first embodiment described above, entropy coding is also performed in the first coding unit 12 and the second coding unit 15 in the first embodiment by using the coding tables.

The operation of the compression device 2e according to the present embodiment is similar to that of the first embodiment described above, except that the symbol string is sorted.

Next, the operation of the notification unit 29 included in the decompression device 2f will be described with reference to FIG. 21. FIG. 21 illustrates, for each cycle, symbols converted from codewords in the first and second channels of the decompression device 2f that inputs the compressed stream output from the compression device 2e as a result of entropy coding on the symbol string 202 illustrated in FIG. 20. Note that FIG. 21 simply illustrates the cycle as the timing when the codeword is converted to a symbol, and the cycle in which the process of storing a packet in response to a packet request described in the first embodiment in a first packet buffer 23 and a second packet buffer 26 is omitted.

As illustrated in FIG. 21, in the cycle 0, the codeword ML0' is converted to the symbol ML0 in the first channel, and the codeword L1' is converted to the symbol L1 in the second channel.

In this case, as the symbol ML0 (the symbol that is the source of dependency) is obtained, the notification unit 29 notifies the first channel (the first decoding unit 24) that entropy decoding of the codeword CN0' converted from the symbol CN0 that is dependent on the symbol ML0 is performed in the next cycle 1. Similarly, the notification unit 29 notifies the second channel (the second decoding unit 27) that entropy decoding of the codeword EX0' converted from the symbol EX0 that is dependent on the symbol ML0 is performed in the next cycle 1.

Here, it is assumed that the first decoding unit 24 and the second decoding unit 27 hold in advance different decoding tables based on the type of the codeword as information for converting a codeword to a symbol. In this case, in the cycle 1, the first decoding unit 24 uses the decoding table according to the notification from the notification unit 29 (that is, the decoding table corresponding to the codeword CN') to convert the codeword CN0' to the symbol CN0. Similarly, in the cycle 1, the second decoding unit 27 uses the decoding table according to the notification from the notification unit 29 (that is, the decoding table corresponding to the codeword EX') to convert the codeword EX0' to the symbol EX0.

As described above, in a case where the past data that matches the dictionary coding target data is present in the history buffer in dictionary coding, if it is predetermined that the results of dictionary coding are output in the order of the match length information (the symbol ML), the first distance information (the symbol CN), and the second distance information (the symbol EX), the notification unit 29 can specify (detect) that entropy decoding of the codeword CN0' is performed in the first channel and entropy decoding of the codeword EX0' is performed in the second channel (that is, channels that perform entropy decoding of the codeword CN0' and the codeword EX0').

Although detailed description is omitted, since the codeword ML3' is converted to the symbol ML3 in the second channel in the cycle 2, the notification unit 29 notifies the first channel (the first decoding unit 24) that entropy decoding is performed on the codeword CN3' converted from the symbol CN3 that is dependent on the symbol ML3 in the next cycle 3, and notifies the second channel (the second decoding unit 27) that entropy decoding is performed on the codeword EX3' converted from the symbol EX3 that is dependent on the symbol ML3 in the next cycle 3. As a result, the first decoding unit 24 can convert the codeword CN3' to the symbol CN3 in the cycle 3 using the decoding table according to the notification from the notification unit 29. Similarly, the second decoding unit 27 can convert the codeword EX3' to the symbol EX3 in the cycle 3 using the decoding table according to the notification from the notification unit 29.

Next, the operation of the sorting unit 30 included in the decompression device 2f will be described. Here, the description will be made with reference to FIG. 20 for the sake of convenience.

First, the symbol string output from the deinterleaving unit 28 is a symbol string in which symbols are sorted by the sorting unit 19 included in the compression device 2e.

Here, it is assumed that the symbol string 202 including the symbols S0, S3, S1, S2, S4, S5, S6, and S7 illustrated in FIG. 20 in order is output from the deinterleaving unit 28. In this case, the sorting unit 30 sorts the symbol string 202 into the symbol string 201 by performing the process reverse to that of the sorting unit 19 described above.

Specifically, the sorting unit 30 classifies the symbols included in the symbol string 202 into the first and second groups described above. In this case, the symbols S0, S3, S4, and S5 are classified into the first group, and the symbols S1, S2, S6, and S7 are classified into the second group.

The sorting unit 30 reproduces the arrangement in the symbol string 201 (the arrangement of the symbols S0 to S7 in the symbol string 201) by arranging the symbols classified into the first and second groups in order from the head (that is, in the input order) as described above.

Specifically, the head symbol of the first group is the symbol S0, and the symbol S0 is the symbol ML0. On the other hand, the head symbol of the second group is the symbol S1, and the symbol S1 is the symbol CN0. In this case, since the symbol CN is a symbol following the symbol ML, the symbol S0 (that is, the symbol ML0) is arranged at the head of the symbol string, and the symbol S1 (that is, the symbol CN0) is arranged next to the symbol S0.

Next, the symbol next to the symbol S0 in the first group is the symbol S3, and the symbol S3 is the symbol L1. On the other hand, the symbol next to the symbol S1 in the second group is the symbol S2, and the symbol S2 is the symbol EX0. In this case, since the symbol EX0 follows the symbol S1 (the symbol CN0) arranged at the end of the symbol string as described above, the symbol S2 is arranged next to the symbol S1.

Note that the symbol next to the symbol S2 in the second group is the symbol S6, and the symbol S6 is the symbol CN3. Since the symbol CN follows the symbol ML, the symbol S3 (that is, the symbol L1) is arranged next to the symbol S2 that is arranged at the end of the symbol string as described above.

Next, the symbol next to the symbol S3 in the first group is the symbol S4, and the symbol S4 is the symbol L2. As described above, since the symbol S3 arranged at the end of the symbol string is the symbol L1 and the symbol S6 (the symbol CN3) cannot be arranged next to the symbol L1, the symbol S4 is arranged next to the symbol S3.

Furthermore, the symbol next to the symbol S4 in the first group is the symbol S5, and the symbol S5 is the symbol ML3. Since the symbol S6 of the second group is the symbol CN3 following the symbol ML3, the symbol S5 (that is, the symbol ML3) is arranged next to the symbol S4 that is arranged at the end of the symbol string.

After the symbol S5 is arranged in this way, the symbol S6 (the symbol CN3) and the symbol S7 (the symbol EX3) of the second group can be arranged in order in the symbol string.

As the process described above is performed in the sorting unit 30, the symbol string 202 can be sorted into the symbol string 201.

In the present embodiment, for convenience of description, the compression device 2e performs entropy coding in the first and second channels, and the decompression device 2f performs entropy decoding in the first and second channels. However, the number of the channels can be three or more.

Figure 22:
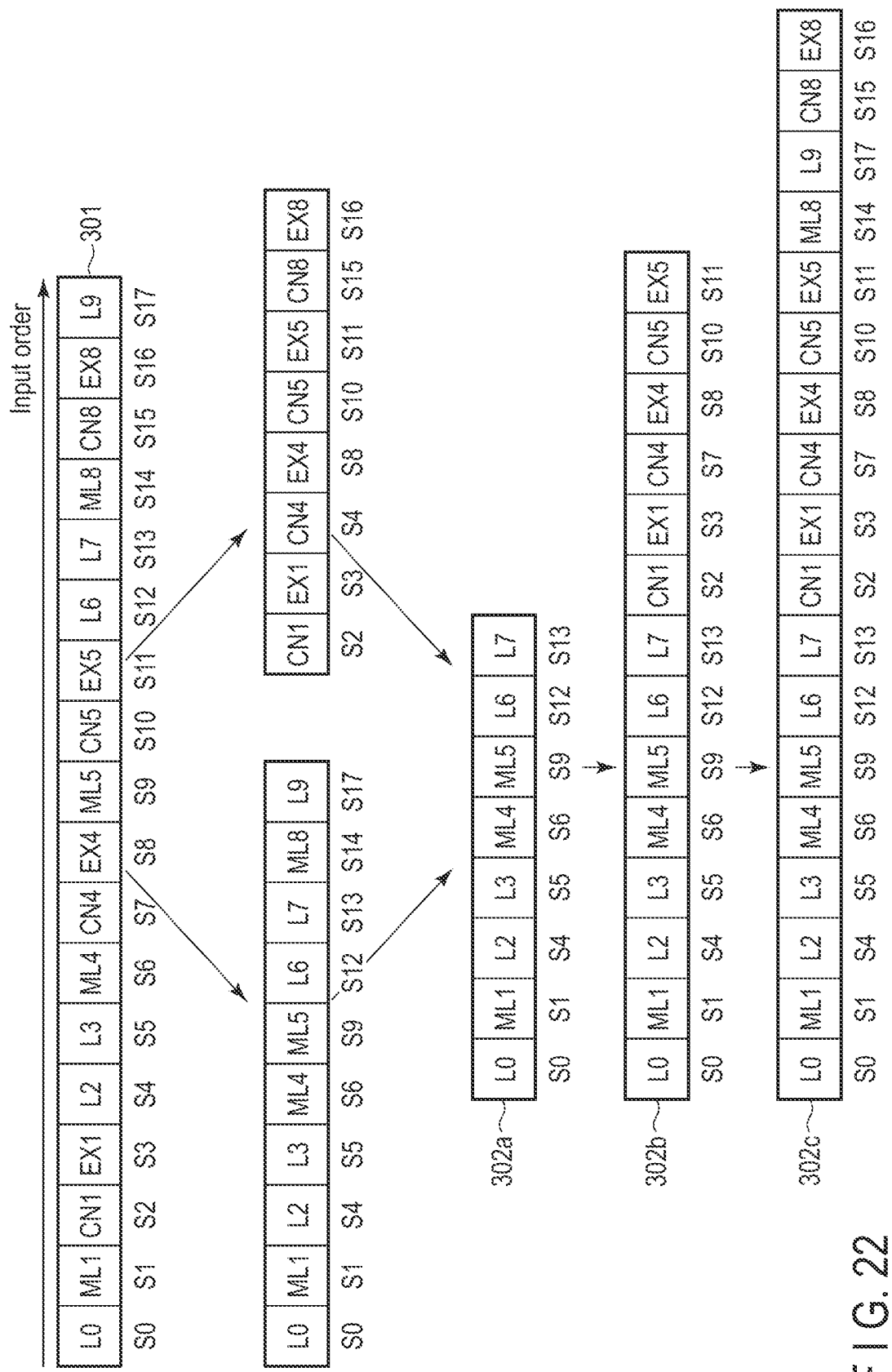
FIG. 22 is a diagram for explaining an operation of the sorting unit in a case where the number of channels is eight in the third embodiment.

Hereinafter, the operation of the sorting unit 19 included in the compression device 2e in a case where the number of channels is eight will be briefly described with reference to FIG. 22. Here, as illustrated in FIG. 22, it is assumed that a symbol string 301 including a plurality of symbols S0 to S17 is sorted.

First, the sorting unit 19 classifies the symbols S0 to S17 included in the symbol string 301 into first and second groups. In this case, the symbols S0, S1, S4, S5, S6, S9, S12, S13, S14, and S17 are classified in the first group, and the symbols S2, S3, S7, S8, S10, S11, S15, and S16 are classified into the second group.

Here, assuming that the interleaving unit 11 distributes the symbols to eight channels (hereinafter referred to as "channels 0 to 7") in order from the head symbol of the symbol string, the sorting unit 19 arranges eight symbols S0, S1, S4, S5, S6, S9, S12, and S13 from the head of the symbols classified into the first group at the head of the symbol string, thereby generating a symbol string 302a. These eight symbols are symbols that are converted from codewords in the first cycle in the channel 0 to channel 8 of the decompression device 2f.

Next, the sorting unit 19 determines the number of symbols classified into the second group to be arranged based on the number of the symbols ML among the symbols arranged in the symbol string 302a (the symbols classified into the first group). In the present embodiment, since there are two symbols CN and EX that are dependent on one symbol ML that is the source of dependency, the number of symbols classified into the second group to be arranged is the number of symbols ML×2.

In the example illustrated in FIG. 22, the number of symbols ML arranged in the symbol string 302a is three, and thus six is determined as the number of symbols classified into the second group to be arranged.

In this case, the sorting unit 19 takes out six symbols CN1 (the symbol S2), symbol EX1 (the symbol S3), symbol CN4 (the symbol S7), and symbol EX4 (the symbol S8), symbol CN5 (the symbol S10), and symbol EX5 (the symbol S11) from the head of the symbols classified into the second group, and adds these six symbols to the symbol string 302a. As a result, a symbol string 302b is generated.

The remaining symbols classified into the first group are then added to the symbol string 202b, and the remaining symbols classified into the second group are further added after the added symbols.

As a result, the sorting unit 19 can sort the symbol string 201 including the symbols S0 to S17 in order into a symbol string 302c including the symbols S0, S1, S4, S5, S6, S9, S12, S13, S2, S3, S7, S8, S10, S11, S14, S17, S15, and S16 in order.

Here, FIG. 23 illustrates, for each cycle, symbols converted from codewords in the channel 0 to the channel 7 of the decompression device 2f that inputs the compressed stream output from the compression device 2e as a result of entropy coding on the symbol string 302c illustrated in FIG. 22.

As illustrated in FIG. 23, in the cycle 0, the codeword ML1' is converted to the symbol ML1 in the channel 1, the codeword ML4' is converted to the symbol ML4 in the channel 4, and the codeword ML5' is converted to the symbol ML5 in the channel 5.

In this case, the notification unit 29 counts the number of symbols ML converted from the codeword ML' in the cycle 0, and specifies (detects) the channel to be notified that entropy decoding is performed on the codewords CN' and EX' in the cycle 1 following the cycle 0 (hereinafter referred to as "notification target channel") based on the counted number of symbols ML.

Note that in a case where the symbol string 301 is sorted into the symbol string 302c as described in FIG. 22, the notification target channels are channels 0 to m, and m is calculated by "number of counted symbols ML×2−1".

In the example illustrated in FIG. 23, m is five because the number of symbols ML converted from the codeword ML' in the cycle 0 is three (the symbol ML1, the symbol ML3, and the symbol ML4).

In this case, the notification unit 29 specifies the channels 0 to 5 as notification target channels, and notifies the channels 0 to 5 that entropy decoding is performed on the codewords CN' and EX' in the next cycle 1.

Note that in the example illustrated in FIG. 23, the channels 0, 2, and 4 are notified that entropy coding is performed on the codeword CN', and the channels 1, 3, and 5 are notified that entropy coding is performed on the codeword EX'. As described above, entropy decoding using the decoding tables according to the notifications from the notification unit 29 is performed in each channel (the decoding unit in each channel).

Further, in a case where the codeword ML1' is converted to the symbol ML1 in the channel 1 during the cycle 1, the channel 0 is notified that entropy decoding is performed on the codeword CN' in the cycle 2 following the cycle 1, and the channel 1 is notified that entropy decoding is performed on the codeword EX' in the cycle 2.

As described above, in the compression device 2e according to the present embodiment, the symbol string is sorted so that entropy decoding of a plurality of codewords (third codewords) converted from a plurality of symbols (third symbols) that have a dependency relationship in the symbol string is not performed in the same cycle, and the symbol string is divided into the first sub-stream and the second sub-stream based on the sorted symbol string.

In this case, for example, the symbol string is sorted so that the order of the symbol ML that is the source of dependency in the first (or second) sub-stream is different from the order of the symbols CN and EX that are dependent in the second (or first) sub-stream.

In the present embodiment, with such a configuration, entropy decoding of the codeword ML' converted from the symbol ML is not performed in parallel with entropy decoding of the codewords CN' and EX' converted from the symbols CN and EX (that is, there is no dependency relationship between channels in the same cycle). As a result, it is possible to avoid the situation in which entropy decoding of the codeword ML' and entropy decoding of the codewords CN' and EX' cannot be performed in the same cycle, and the throughput of the decompression device 2f can be improved.

Note that in the decompression device 2f according to the present embodiment, for example, in a case where the symbol converted from a codeword in the cycle 0 (the first cycle) is the symbol ML (a symbol that has a dependency relationship with other symbols CN and EX), at least one of the first and second channels (the first decoding unit 24 and the second decoding unit 27) is notified that entropy decoding of the codewords CN' and EX' converted from the symbols CN and EX is performed in the cycle 1 following the cycle 0 (the second cycle), and at least one of the first decoding unit 24 and the second decoding unit 27 performs entropy decoding according to the notification.

In this case, the channel in which entropy decoding is performed on the codewords CN' and EX' in the cycle 1 is specified, for example, based on the number of symbols that are converted from the codewords in the cycle 0 and the source of dependency.

Furthermore, in the compression device 2e, the first coding unit 12 and the second coding unit 15 perform entropy coding on each symbol (each piece of the literal information, the match length information, and the distance information) using a coding table based on the type of the symbol. In the decompression device 2f, the first decoding unit 24 and the second decoding unit 27 perform entropy decoding using the decoding table according to the notification (that is, the decoding table based on the type of the codeword).

In the present embodiment, with the configuration described above, it is possible to appropriately perform entropy decoding in the decompression device 2f.

Note that the present embodiment has described the case where the configuration in which the symbol string is sorted is adopted in the first embodiment, but the present embodiment can be combined with the second embodiment described above. That is, the present embodiment can have a configuration in which the symbol string is sorted in the second embodiment described above.

According to at least one embodiment described above, it is possible to provide a compression device and a decompression device capable of improving the compression efficiency.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A compression device comprising:
an interleaving unit configured to divide a symbol string which is input into a plurality of first symbols and a plurality of second symbols different from the first symbols;
a first coding unit configured to perform coding on the first symbols to convert the first symbols to a plurality of first codewords;
a first packet generating unit configured to generate first packets, the first packets including the first codewords;
a first request generating unit configured to generate first packet requests including sizes of variable length packets based on code length of each of the first codewords;
a second coding unit configured to perform coding on the second symbols to convert the second symbols to a plurality of second codewords;
a second packet generating unit configured to generate second packets, the second packets including the second codewords;
a second request generating unit configured to generate second packet requests including sizes of variable length packets based on code length of each of the second codewords; and
a multiplexer configured to cut out first variable length packets from the first packets based on the sizes of the variable length packets included in the first packet requests, cut out second variable length packets from the second packets based on the sizes of the variable length packets included in the second packet requests, and output a compressed stream including the first and second variable length packets.

2. The compression device according to claim 1,
wherein a decompression device configured to output the symbol string from the compressed stream which is output comprises a first decoding unit configured to perform decoding on a plurality of first codewords included in first variable length packets included in the compressed stream to convert the first codewords to the first symbols, and a second decoding unit configured to perform decoding on a plurality of second codewords included in second variable length packets included in the compressed stream to convert the second codewords to the second symbols,
the first request generating unit is configured to generate the first packet requests by simulating the state of a first buffer configured to store the first variable length packets when the first decoding unit performs decoding on the first codewords, and
the second request generating unit is configured to generate the second packet requests by simulating the state of a second buffer that stores the second variable length packets when the second decoding unit performs decoding on the second codewords.

3. The compression device according to claim 2,
wherein the first request generating unit is configured to determine the sizes of variable length packets included in the first packet requests based on the remaining amount of packets stored in the first buffer simulated, and
the second request generating unit is configured to determine the sizes of variable length packets included in the second packet requests based on the remaining amount of packets stored in the second buffer simulated.

4. The compression device according to claim 3,
wherein the first request generating unit is configured to determine the sizes of variable length packets included in the first packet requests in a manner that the remaining amount of packets stored in the first buffer simulated is more than or equal to the maximum code length, and
the second request generating unit is configured to determine the sizes of variable length packets included in the second packet requests in a manner that the remaining amount of packets stored in the second buffer simulated is more than or equal to the maximum code length.

5. The compression device according to claim 2,
wherein the first request generating unit is configured to determine the sizes of variable length packets included in the first packet requests based on the amount of processed packets stored in the first buffer simulated, and
the second request generating unit is configured to determine the sizes of variable length packets included in the second packet requests based on the amount of processed packets stored in the second buffer simulated.

6. The compression device according to claim 2, wherein at the head of the compressed stream first variable length packets with the sizes based on the capacity of the first buffer and second variable length packets with the sizes based on the capacity of the second buffer are located.

7. The compression device according to claim 1,
wherein in a case where fixed length packets are generated in order from the head of the first codewords, the first request generating unit is configured to judge whether each of the first codewords crosses the boundaries of fixed length packets, and determine the sizes of variable length packets included in the first packet requests according to the judgements, and
in the case where fixed length packets are generated in order from the head of the second codewords, the second request generating unit is configured to judge whether each of the second codewords crosses the boundaries of fixed length packets, and determine the sizes of variable length packets included in the second packet requests according to the judgements.

8. The compression device according to claim 1,
wherein the first coding unit is configured to perform variable length coding on the first symbols, and
the second coding unit is configured to perform variable length coding on the second symbols.

9. The compression device according to claim 1, wherein the sizes of variable length packets included in the first packet requests and the sizes of variable length packets included in the second packet requests are selected from a plurality of predetermined sizes.

10. The compression device according to claim 1 further comprising
a sorting unit configured to sort the symbol string in a manner that decoding of a plurality of third codewords converted from a plurality of third symbols in the symbol string which are dependent of each other is not performed in a same cycle in a decompression device,
wherein the interleaving unit is configured to divide the symbol strings into the first symbols and the second symbols according to the symbol string sorted.

11. The compression device according to claim 10,
wherein a plurality of third symbols that have the dependency relationship include a symbol that is a source of dependency and a symbol that is dependent, and
the order of the symbol that is the source of dependency in the first symbols or the second symbols is different from the order of the symbol that is dependent on the first symbols or the second symbols.

12. The compression device according to claim 11,
wherein the symbol string includes the result of dictionary coding on uncompressed data,
the dictionary coding is a coding method that converts the uncompressed data to relative references of data older than the uncompressed data,
the result of the dictionary encoding includes first information indicating the uncompressed data in a case where the uncompressed data does not match the past data, second information indicating a length at which the uncompressed data matches the past data in a case where the uncompressed data matches the past data, and third information indicating a position of the past data,
the symbol that is the source of dependency includes the second information, and
the symbol that is dependent includes the third information.

13. The compression device according to claim 12, wherein the first and second coding units are configured to perform coding on each piece of the first to third information using different coding tables.

14. A decompression device configured to input a compressed stream output from the compression device according to claim 10, the decompression device comprising:
a demultiplexer configured to cut out the first and second variable length packets from the compressed stream;
a third request generating unit configured to generate third packet requests including the sizes of variable length packets;
a first decoding unit configured to perform decoding on each of a plurality of first codewords included in the first variable length packets output from the demultiplexer based on the third packet requests to convert the first codewords to the first symbols;
a fourth request generating unit configured to generate fourth packet requests including the sizes of variable length packets;
a second decoding unit configured to perform decoding on each of a plurality of second codewords included in the second variable length packets output from the demultiplexer based on the fourth packet requests to convert the second codewords to the second symbols;
a notification unit configured to notify at least one of the first and second decoding units that, in a case where a first symbol converted from the first codeword in a first cycle or a second symbol converted from the second codeword in the first cycle is the third symbol, decoding is performed on a third codeword converted from another third symbol in a second cycle following the first cycle; and
a deinterleaving unit configured to output a symbol string including the first symbols and the second symbols,
wherein at least one of the first and second decoding units are configured to perform decoding on the first or second codewords according to the notification.

15. The decompression device according to claim 14, wherein the notification unit is configured to specify at least one of the first and second decoding units that performs decoding on a codeword converted from a symbol that is dependent in the second cycle based on a number of symbols that are converted from the first and second codewords in the first cycle and are a source of dependency.

16. The decompression device according to claim 15, wherein the first and second decoding units are configured to perform decoding on the first and second codewords using decoding tables according to the notifications.

17. A decompression device configured to input a compressed stream output from the compression device according to claim 1, the decompression device comprising:
a demultiplexer configured to cut out the first and second variable length packets from the compressed stream;
a third request generating unit configured to generate third packet requests including the sizes of variable length packets;
a first decoding unit configured to perform decoding on each of a plurality of first codewords included in first variable length packets output from the demultiplexer based on the third packet requests to convert the first codewords to the first symbols;
a fourth request generating unit configured to generate fourth packet requests including the sizes of variable length packets;
a second decoding unit configured to perform decoding on each of a plurality of second codewords included in second variable length packets output from the demultiplexer based on the fourth packet requests to convert the second codewords to the second symbols; and
a deinterleaving unit configured to output a symbol string including the first symbols and the second symbols.

18. The decompression device according to claim 17, further comprising:
a first buffer configured to store first variable length packets output from the demultiplexer based on the third packet requests; and
a second buffer configured to store second variable length packets output from the demultiplexer based on the fourth packet requests,
wherein the third request generating unit is configured to determine the sizes of a variable length packets included in the third packet requests based on the state of the first buffer, and
the fourth request generating unit is configured to determine the sizes of variable length packets included in the fourth packet requests based on the state of the second buffer.

19. The decompression device according to claim 18,
wherein the third request generating unit is configured to determine the sizes of variable length packets included in the third packet requests based on the remaining amount of packets data stored in the first buffer, and
the fourth request generating unit is configured to determine the sizes of variable length packets included in the fourth packet requests based on the remaining amount of packets data stored in the second buffer.

20. The decompression device according to claim 19,
wherein the third request generating unit is configured to determine the sizes of variable length packets included in the third packet requests in a manner that the remaining amount of packets data stored in the first buffer is more than or equal to the maximum code length, and
the fourth request generating unit is configured to determine the sizes of variable length packets included in the fourth packet requests in a manner that the remaining amount of packets data stored in the second buffer is more than or equal to the maximum code length.

21. The decompression device according to claim 18,
wherein the third request generating unit is configured to determine the sizes of variable length packets included in the third packet requests based on the processed amount of data in the first variable length packets stored in the first buffer, and the fourth request generating unit is configured to determine the sizes of variable length packets included in the fourth packet requests based on the processed amount of data in the second variable length packets stored in the second buffer.

22. The decompression device according to claim 18,
wherein the first buffer is configured to store a first variable length packet that is located at the head of a plurality of first variable length packets included in the compressed stream and has a size based on the size of the first buffer before the first decoding unit performs decoding, and the second buffer is configured to store a second variable length packet that is located at the head of a plurality of second variable length packets included in the compressed stream and has a size based on the size of the second buffer before the second decoding unit performs decoding.

23. The decompression device according to claim 18,
wherein in a case where fixed length packets are generated in order from the head of a plurality of first codewords included in the first variable length packets stored in the first buffer, the third request generating unit is configured to judge whether each of the first codewords crosses the boundaries of the fixed length packets, and determine the sizes of variable length packets included in the third packet requests according to the results of the judgements, and in a case where fixed length packets are generated in order from the head of a plurality of first codewords included in the second variable length packets stored in the second buffer, the fourth request generating unit is configured to determine whether each of the second codewords crosses boundaries of the fixed length packets, and determine the sizes of variable length packets included in the fourth packet requests according to the results of the judgement.

24. The decompression device according to claim 17,
wherein the first decoding unit is configured to perform variable length decoding on the first codewords, and the second decoding unit is configured to perform variable length decoding on the second codewords.

25. The decompression device according to claim 17,
wherein the sizes of variable length packets included in the third packet requests and the sizes of variable length packets included in the fourth packet requests are selected from a plurality of predetermined sizes of a variable length packet.

* * * * *